United States Patent
Wallace

(10) Patent No.: US 11,991,846 B2
(45) Date of Patent: May 21, 2024

(54) CABLE MANAGEMENT SYSTEM

(71) Applicant: Lenovo (Singapore) Pte. Ltd., Singapore (SG)

(72) Inventor: Brian William Wallace, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/402,946

(22) Filed: Aug. 16, 2021

(65) Prior Publication Data
US 2023/0052654 A1 Feb. 16, 2023

(51) Int. Cl.
*H05K 5/02* (2006.01)
*G06F 1/16* (2006.01)
*H01R 13/639* (2006.01)

(52) U.S. Cl.
CPC ......... *H05K 5/0247* (2013.01); *G06F 1/1607* (2013.01); *H01R 13/639* (2013.01)

(58) Field of Classification Search
CPC ............... H05K 5/0247; H05K 5/0017; H05K 7/20972; H05K 5/0204; H05K 7/1447; G06F 1/1607; G06F 1/1601; G06F 1/1603; G06F 1/1605; H01R 13/639; F16M 11/041; F16M 11/105; F16M 13/022; F16M 11/16; F16M 11/2021; F16M 11/22; F16M 13/00; F16M 13/02; F16M 11/08; H02G 3/32; H02G 11/00; H02G 3/266
See application file for complete search history.

(56) References Cited

U.S. PATENT DOCUMENTS

| | | | | |
|---|---|---|---|---|
| 4,224,465 A | * | 9/1980 | Ruzic | H04M 1/15 439/459 |
| 4,371,137 A | * | 2/1983 | Anscher | F16L 3/23 248/74.3 |
| 4,439,896 A | * | 4/1984 | Matsui | F16L 3/233 24/16 PB |
| 4,538,875 A | * | 9/1985 | Krenz | H01R 13/58 439/502 |
| D291,177 S | * | 8/1987 | Santucci | D8/382 |
| D302,938 S | * | 8/1989 | Fujioka | D8/356 |
| 4,852,843 A | * | 8/1989 | Chandler | B60N 3/104 220/737 |
| 5,221,813 A | * | 6/1993 | Michael | H05K 5/0247 174/659 |

(Continued)

FOREIGN PATENT DOCUMENTS

DE 202014010842 U1 * 12/2016 ............. A47B 97/00

OTHER PUBLICATIONS

Michalonex, "USB Cable Car Vent Holder", Apr. 11, 2020, Thingiverse. com, retrieved from https://www.thingiverse.com/thing:4278817 (Year: 2020).*

(Continued)

*Primary Examiner* — Abhishek M Rathod
(74) *Attorney, Agent, or Firm* — Brian J. Pangrle

(57) ABSTRACT

A system can include a display assembly that includes a display, a display side, a back side, a frame and a serial bus socket; and a cable clip, removably attachable to the back side of the display assembly, that receives a portion of a cable that includes a serial bus connector receivable by the serial bus socket.

17 Claims, 16 Drawing Sheets

(56) References Cited

U.S. PATENT DOCUMENTS

| | | | | |
|---|---|---|---|---|
| 5,657,209 | A * | 8/1997 | Batten, Jr. | H05K 5/0247 174/91 |
| 5,782,090 | A * | 7/1998 | Locke | F16L 3/127 248/74.2 |
| 5,871,366 | A * | 2/1999 | Nishikigi | B60R 16/027 439/15 |
| 6,220,554 | B1 * | 4/2001 | Daoud | H02G 3/32 248/74.1 |
| 6,244,545 | B1 * | 6/2001 | McCrary | F16L 3/00 248/220.21 |
| 6,271,476 | B1 * | 8/2001 | Bobowick | H05K 7/1448 174/59 |
| 6,546,181 | B1 * | 4/2003 | Adapathya | G02B 6/4452 385/135 |
| 6,587,151 | B1 * | 7/2003 | Cipolla | G06F 1/1607 D16/202 |
| 6,708,942 | B2 * | 3/2004 | Barkan | F16M 11/041 248/500 |
| 6,816,364 | B2 * | 11/2004 | Helot | G06F 1/1601 248/920 |
| 6,855,890 | B1 * | 2/2005 | Vasichek | H02G 3/30 248/65 |
| 7,304,861 | B2 * | 12/2007 | Takahashi | H05K 3/301 248/74.3 |
| 7,622,673 | B2 * | 11/2009 | Quijano | H02G 3/081 174/101 |
| 7,784,745 | B2 * | 8/2010 | Dodge | F16L 3/1075 138/158 |
| 7,821,589 | B2 * | 10/2010 | Park | G02B 6/0083 349/58 |
| 7,825,337 | B2 * | 11/2010 | Young, IV | H02G 3/30 174/72 A |
| 7,856,746 | B1 * | 12/2010 | Araujo | G09F 3/0295 24/543 |
| 8,435,067 | B2 * | 5/2013 | Wegener | H01R 13/5833 439/906 |
| 8,593,567 | B2 * | 11/2013 | Xiao | H04N 23/50 348/373 |
| 9,012,775 | B2 * | 4/2015 | Yang | H05K 7/1447 248/62 |
| 9,080,714 | B2 * | 7/2015 | Minn | F16M 11/105 |
| 9,256,249 | B2 * | 2/2016 | Truong | G06F 1/1601 |
| 9,304,060 | B2 * | 4/2016 | Husted | G01M 15/10 |
| 9,339,112 | B2 * | 5/2016 | Wengreen | F16M 13/02 |
| 9,866,005 | B2 * | 1/2018 | Feige | H02G 7/08 |
| 10,122,900 | B2 * | 11/2018 | Liu | H04N 23/51 |
| 10,130,731 | B2 * | 11/2018 | Esses | A61L 9/03 |
| RE47,215 | E * | 1/2019 | Huang | G06F 1/184 |
| 10,206,299 | B2 * | 2/2019 | Kim | H05K 7/1427 |
| 10,440,852 | B1 * | 10/2019 | Shearman | H05K 7/20709 |
| 10,738,813 | B2 * | 8/2020 | Jung | F16B 5/07 |
| 11,002,382 | B2 * | 5/2021 | Takatori | F16L 3/1226 |
| 11,018,484 | B2 * | 5/2021 | Yokoi | H02G 3/30 |
| D939,327 | S * | 12/2021 | Wang | D8/356 |
| 11,343,934 | B2 * | 5/2022 | Chang | G06F 1/183 |
| 11,433,155 | B2 * | 9/2022 | Bourne | A61L 9/127 |
| 11,489,326 | B1 * | 11/2022 | Chung | H02G 11/00 |
| 2004/0047115 | A1 * | 3/2004 | Helot | F16M 11/2021 361/679.06 |
| 2004/0159454 | A1 * | 8/2004 | Shibuya | B60R 16/0215 174/545 |
| 2005/0016760 | A1 * | 1/2005 | Vasichek | B60R 16/0215 174/135 |
| 2005/0258314 | A1 * | 11/2005 | Schilles | B60R 16/0215 248/74.1 |
| 2006/0124804 | A1 * | 6/2006 | Lin | F16M 11/22 248/65 |
| 2006/0180716 | A1 * | 8/2006 | Tan | H02G 3/32 248/68.1 |
| 2007/0001087 | A1 * | 1/2007 | Shyu | F16M 11/10 248/688 |
| 2007/0084621 | A1 * | 4/2007 | Martin | G06F 1/1603 174/97 |
| 2008/0121763 | A1 * | 5/2008 | Mori | H02G 3/32 248/68.1 |
| 2012/0001031 | A1 * | 1/2012 | Negel | B60R 16/0215 248/68.1 |
| 2012/0162869 | A1 * | 6/2012 | Li | H05K 5/0247 361/679.01 |
| 2012/0174349 | A1 * | 7/2012 | Fannon | H02G 3/32 24/457 |
| 2013/0256472 | A1 * | 10/2013 | Liu | H05K 5/0247 248/74.4 |
| 2013/0266486 | A1 * | 10/2013 | Wu | A61L 9/12 422/123 |
| 2013/0294018 | A1 * | 11/2013 | Mochizuki | F16L 3/06 361/679.01 |
| 2015/0069197 | A1 * | 3/2015 | Mitchell | F16B 2/22 248/221.11 |
| 2015/0108287 | A1 * | 4/2015 | Arai | H05K 5/0204 248/65 |
| 2016/0047494 | A1 * | 2/2016 | Dickinson | F16L 3/13 248/74.1 |
| 2016/0347257 | A1 * | 12/2016 | Buchanan | F16M 13/00 |
| 2018/0317334 | A1 * | 11/2018 | Grotz | B60R 16/0238 |
| 2019/0222012 | A1 * | 7/2019 | Lopez | H02G 3/02 |
| 2020/0174520 | A1 * | 6/2020 | Neukam | G06F 1/1607 |
| 2021/0247002 | A1 * | 8/2021 | Dallmann | H02G 3/32 |
| 2021/0356147 | A1 * | 11/2021 | Basile | A61L 9/04 |
| 2022/0352626 | A1 * | 11/2022 | Ragos | H01Q 1/246 |

OTHER PUBLICATIONS

Translation of DE 202014010842 U1 (Year: 2016).*
Minitech, "Cable Clip", 2017, MiniTech Framing, retrieved from https://www.minitecframing.com/Products/Electrical%20Installation/Catalog_Pages/22.1204_Cable_Clip.html (Year: 2017).*

* cited by examiner

CABLE MANAGEMENT SYSTEM

TECHNICAL FIELD

Subject matter disclosed herein generally relates to computing and display devices.

BACKGROUND

A system can include a display assembly with a display where the display assembly can include a socket for purposes of data and/or power transmission to an accessory via a cable with a connector received by the socket.

SUMMARY

A system can include a display assembly that includes a display, a display side, a back side, a frame and a serial bus socket; and a cable clip, removably attachable to the back side of the display assembly, that receives a portion of a cable that includes a serial bus connector receivable by the serial bus socket. A cable clip can include a connector portion removably attachable to a back side of a display assembly; and a cable guide portion that receives a portion of a cable that can include a serial bus connector receivable by a serial bus socket of the display assembly. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
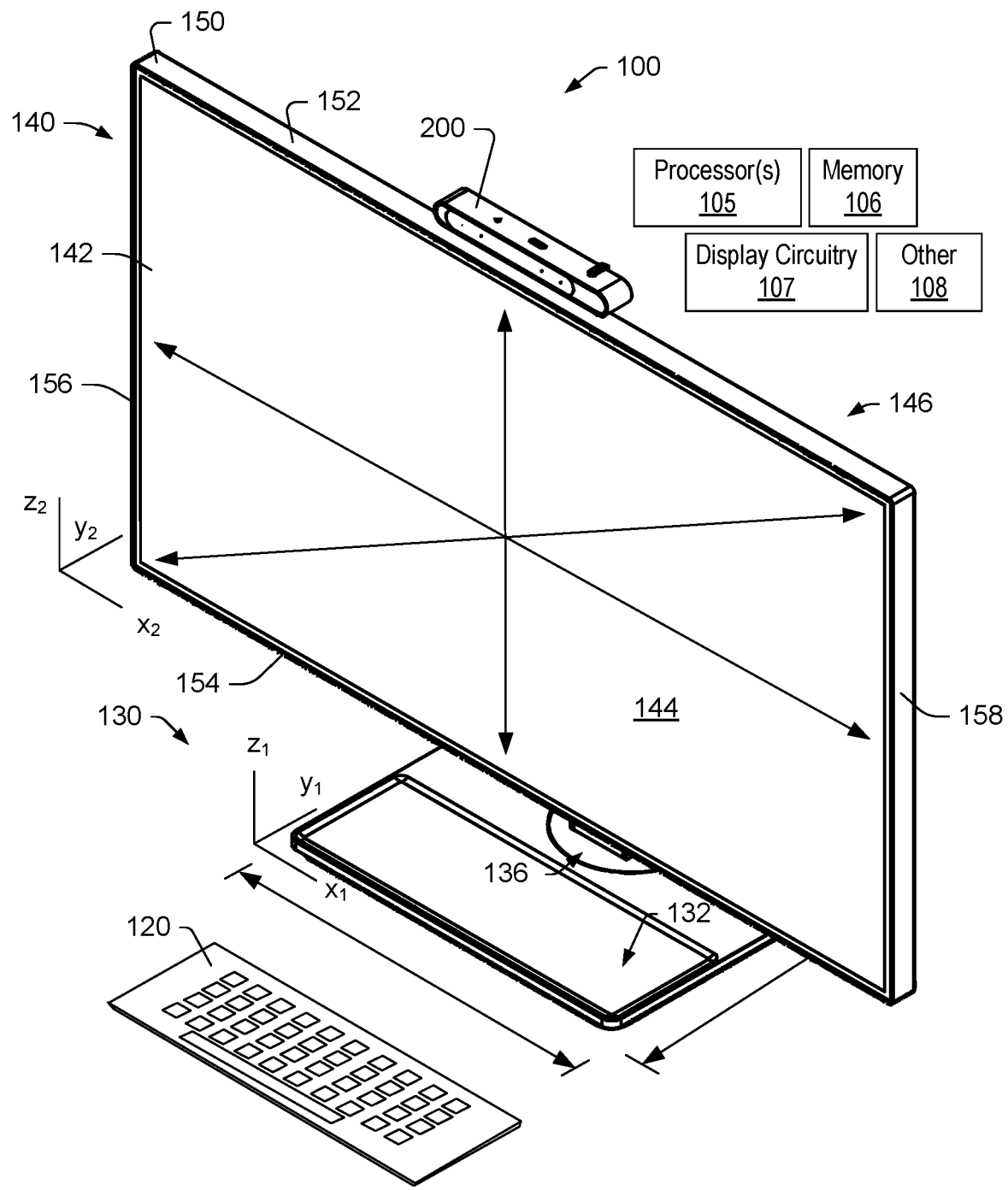
FIG. 1 is a perspective view of an example of a system.

FIG. 1 shows a perspective view of an example of a system 100 that can include one or more processors 105, memory 106 accessible to at least one of the one or more processors 105, display circuitry 107 and one or more other components 108, which can include electronic circuitry, instructions stored in the memory 106 and executable by at least one of the one or more processors 105, etc. As an example, the system 100 may include one or more accessories, peripherals, etc. For example, consider a keyboard 120 that may be operatively coupled to at least one of the one or more processors 105.

As shown in FIG. 1, the system 100 includes a display assembly 140 with a display 142 that may utilize one or more technologies (e.g., LED, LCD, etc.). The display assembly 140 can include a display side 144, a back side 146 and a frame 150. The display circuitry 107 can be operatively coupled to at least one of the one or more processors 105, for example, to receive data, instructions, etc., for rendering text, graphics, images, etc., to the display side 144 of the display 142.

As an example, the display circuitry 107 can include one or more graphics processing units (GPUs) and, for example, one or more of the one or more processors 105 can be a central processing unit (CPU). As an example, the display circuitry 107 can include input circuitry such as touch circuitry, digitizer circuitry, etc., such that the display side 144 is an input surface. For example, the display side 144 may receive input via touch, a stylus, etc. As an example, the display assembly 140 can include a touchscreen display where a finger, a stylus, etc., can be utilized; noting sensing as to input may occur with or without physical contact between a finger and the display side 144, between a stylus and the display side 144, etc., depending on the type of input circuitry utilized (e.g., resistive, capacitive, acoustic wave, infrared, optical, dispersive signal, etc.).

In the example of FIG. 1, the system 100 can include a base 130 that includes an upper surface 132 and an arm 136 that is operatively coupled to the display assembly 140. For example, the arm 136 can extend from the base 130 where the display assembly 140 includes an arm mount that couples the arm 136 to the display assembly 140, for example, on the back side 142 of the display assembly 140 that is opposite the display side 144 of the display assembly 140. As an example, the base 130 and the arm 136 can be a stand for the display assembly 140.

As shown in the example of FIG. 1, the display side 144 may be centered along a centerline of the system 100 and may be disposed at an angle that can be defined by the base 130 or a flat support surface such as a desktop, a tabletop, a countertop, etc., where the base 130 or the flat support surface can be planar and horizontal. As shown, the arm 136 rises from the base 130 at an angle that may be normal to the base 130 or the flat support surface (e.g., a 90 degree angle). As to an angle of the display side 144, it may be 90 degrees, greater than 90 degrees or less than 90 degrees.

The display side 144 can be part of the display 142 that includes or is operatively coupled to the display circuitry 107, which may include one or more types of touch, digitizer, etc., circuitry. As shown, the base 130 and the display assembly 140 and/or the display side 144 can be defined with respect to one or more coordinate systems such as, for example, one or more Cartesian coordinate systems (see, e.g., $x_1, y_1, z_1$ and $x_2, y_2, z_2$). As shown, the display side 144 can be defined by a display area, which may be two-dimensional for a substantially flat (e.g., planar) display surface or which may be three-dimensional for a curved display surface, noting that such a curve may be of a relatively large radius of curvature (e.g., 50 cm or more) that gives the display a gentle curve (e.g., consider a radius of approximately the length of an extended arm of a user as traced by movement left and right from a shoulder of a user positioned in front of the display surface by an ergonomic distance). As shown, the arm 136 of the base 130 can be utilized to provide a gap or clearance between a lower edge of the display assembly 140 and a support surface on which the base 130 is supported (e.g., a desktop, tabletop, countertop, etc.). Such a gap may provide for rotation of the display 142 (e.g., from a landscape orientation to a portrait orientation).

In the example of FIG. 1, the frame 150 can include edges 152, 154, 156 and 158 where the edges 152 and 154 are long edges and where the edges 156 and 158 are short edges. For example, the frame 150 can be substantially rectangular (e.g., a rectangular form factor) and planar or rectangular and curved. The frame 150 may include a landscape orientation as shown in FIG. 1 where the long edges 152 and 154 are substantially horizontal and a portrait orientation where the long edges 152 and 154 are rotated by approximately 90 degrees to be substantially vertical. The ability to transition from one orientation to the other may provide a user with options that can be ergonomic, content dependent, etc. In the example of FIG. 1, the system 100 can include features that provide for transitioning the frame 150 between portrait and landscape orientations.

As an example, the display assembly 140 may include a bezel or bezels that occupy a portion of the front side (e.g., the display side 144) or the display assembly 140 may be substantially bezel-less or completely bezel-less. A bezel-less display assembly can provide for a display surface dimensions that are approximately the same as frame dimensions. As an example, where a frame edge thickness is visible from a display side, the frame edge thickness may be less than approximately 0.5 cm in thickness and considered part of a substantially bezel-less approach. Where a display extends to an edge, where a frame edge thickness is not visible, such an approach can be considered part of a bezel-less approach. Bezel and bezel-less can be defined with respect to active display area as in some display assemblies, a bezel may be internal, being disposed beneath a cover glass.

Where a display assembly is bezel-less, space does not exist for a bezel integrated front facing camera. And where a display assembly includes a bezel along at least one edge, integration of a front facing camera into a bezel region takes space and may dictate the size of the bezel and hence a ratio of display assembly area to active display area. In some instances, a camera-less display assembly may be desirable. And, where a camera is not desired, it may be easier to manufacture a display assembly that is a bezel-less.

In the example of FIG. 1, the system 100 can include the display assembly 140 and a camera assembly 200, which may be part of a kit where a user can couple the camera assembly 200 to the display assembly 140 or not. In the example of FIG. 1, the camera assembly 200 is positioned on the frame 150, along the long edge 152. As an example, the camera assembly 200 may be suitable for being positioned on the frame 150 along one of the short edges 156 and 158.

A position of the camera assembly 200 can be defined, for example, using one or more of the coordinate systems shown in FIG. 1. For example, a height of the camera assembly 200 can be determined using coordinates of the coordinate system $x_2$, $y_2$, and $z_2$ with reference to coordinates of the coordinate system and $x_1$, $y_1$, and $z_1$ or, for example, the height of the camera assembly 200 may be defined with respect to the coordinate system $x_1$, $y_1$, and $z_1$ alone (e.g., a height along $z_1$). Appropriate coordinates of either or both of the coordinate systems may be utilized for a landscape orientation or a portrait orientation of the display assembly 140.

As an example, the camera assembly 200 can include one or more cameras that may individually or collectively define a field of view (FOV). For optical elements, cameras, etc., the field of view (FOV) can be defined by a solid angle through which electromagnetic radiation can be received. In photography, the field of view is that part of the world that is visible through a camera at a particular position and orientation in space; objects outside a FOV when an image is captured are not recorded in the image. In photography, FOV may be expressed as an angular size of a view cone, as an angle of view. For a normal lens, the diagonal field of view can be calculated FOV=2 arc tan(SensorSize/2f), where f is focal length.

An angle of view can differ from an angle of coverage, which describes the angle range that a lens can image. An image circle produced by a lens or optical element assembly can be configured to be large enough to cover a photosensor, for example, with no or minimal vignetting toward edges. If the angle of coverage of the lens does not fill the photosensor, the image circle will be visible, with strong vignetting toward the edges, and the effective angle of view can be limited to the angle of coverage.

In the example of FIG. 1, the camera assembly 200 is positioned to provide a forward FOV such that a user of the system 100 can be imaged, for example, for purposes of videoconferencing. The camera assembly 200 may include an adjustable mount where, for example, a user positioned in front of the system 100 may be brought into the FOV of the camera assembly 200 via the adjustable mount. As an example, an adjustable mount may provide for rotation of the camera assembly 200, for example, to allow for a backward facing FOV. As an example, the camera assembly 200 may include multiple cameras, which may include one or more front facing cameras and one or more back facing cameras. In the example of FIG. 1, the camera assembly can include features that provide for tilting, for example, tilting down or tilting up, which may provide for adjustments where the display side 144 is tilted down or tilted up. As an example, the camera assembly 200 may be tiltable and rotatable.

Figure 2:
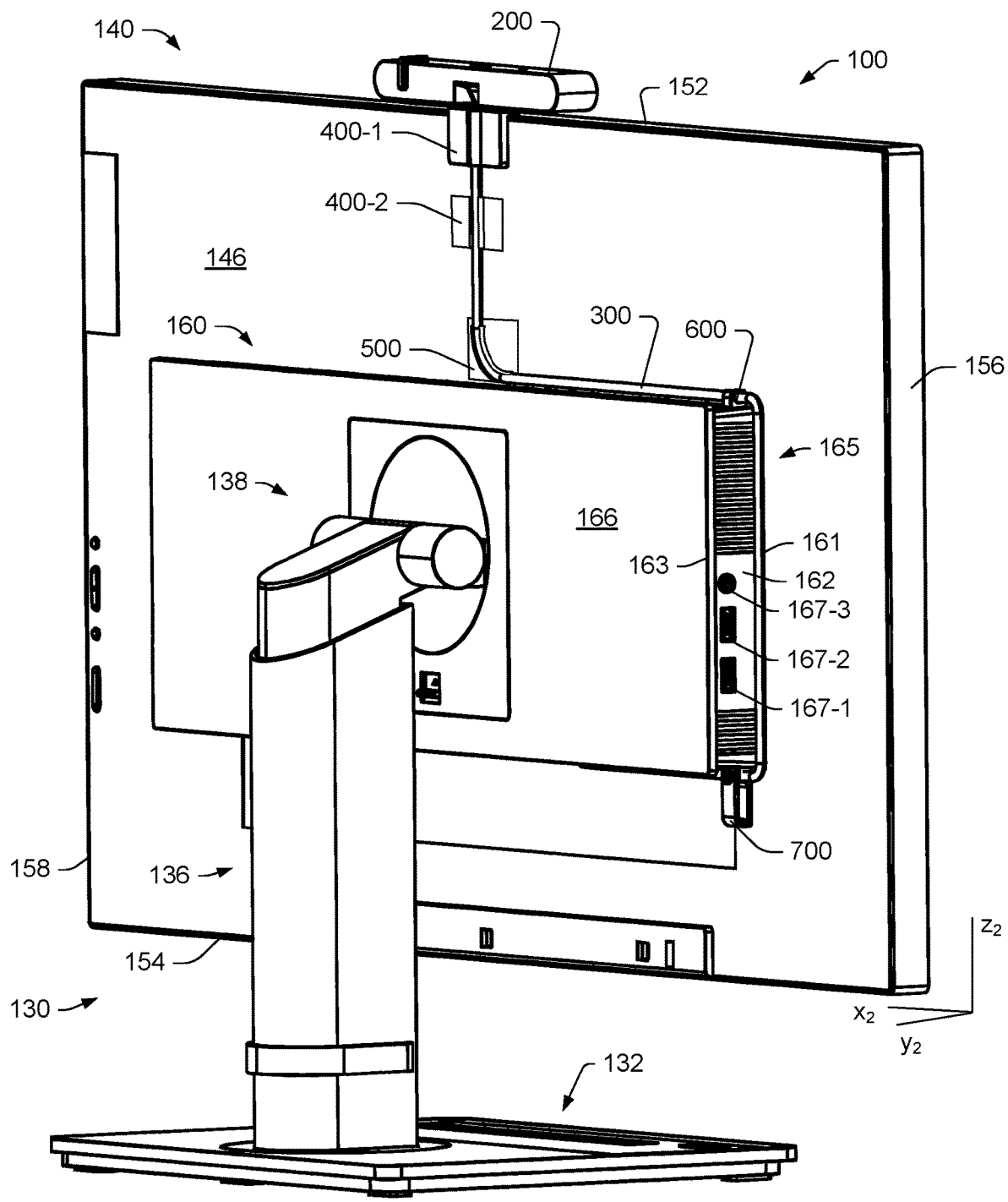
FIG. 2 is another perspective view of the system of FIG. 1.

FIG. 2 shows another perspective view of the system 100 where the camera assembly 200 is shown as including a cable 300 where various cable clips 400-1, 400-2, 500, 600 and 700 can guide the cable 300 along the back side 146 of the display assembly 140. In such an example, cable clips can be part of a cable management strategy that promotes a more uncluttered workspace (e.g., a "clean" workspace). As an example, a kit may include one or more cable clips, which may be, for example, one or more of the cable clips 400-1, 400-2, 500, 600 and 700, etc.

In the example of FIG. 2, the base 130 can be operatively coupled to the display assembly 140 via an arm mount 138, which may provide for rotation of the display assembly 140 between landscape and portrait orientations (e.g., for a display with a rectangular form factor). For example, consider a turntable that allows for rotation of the display assembly 140. In the example of FIG. 2, the cable clips 400-1, 400-2, 500, 600 and 700 can be positionable where, for example, a user desires mounting the camera assembly 200 along one of the short edges 156 and 158 of the frame 150 or along the other long edge 154 of the frame 150.

One or more types of accessories may be attachable to a display assembly where such accessories include a cable for purposes of data and/or power transmission. For example, consider a serial bus cable such as a USB cable. As to some examples of types of accessories, consider cameras, microphones, camera/microphone assemblies, lights, etc.

In the example of FIG. 2, the cable clips 400-1, 400-2, 500, 600 and 700 can manage one or more cables of one or more accessories that can attach to the display assembly 140. Such cable clips may utilize one or more vents, one or more magnetic materials, etc.

As shown in FIG. 2, the display assembly 140 can include a back side housing 160 (e.g., a rear bump, etc.) that includes an edge 161, a wall 162 that extends outwardly from the edge 161 to another edge 163 that can define a perimeter of a back surface 166 of the housing 160. In the example of FIG. 2, various vents 165 are shown as being disposed within the wall 162 (e.g., a vented wall). The wall 162 is also shown as including one or more sockets 167-1, 167-2, 167-3, etc.; noting that the housing 160 and/or another portion or portions of the display assembly 140 can include one or more sockets (e.g., connectors, etc.). As an example, the back side housing 160 can house various types of circuitry such as one or more of the one or more processors 105, the memory 106, the display circuitry 107 and the other circuitry 108. As an example, the back side housing 160 can house one or more features of an all-in-one (AIO) computing system.

As shown in FIG. 2, the housing 160 forms a horizontal ledge running generally along the $x_2$ coordinate direction with respect to the back side 146 and a vertical ledge running generally along the $z_2$ coordinate direction with respect to the back side 146. A ledge can be part of a step such as a step surface (e.g., a tread, a riser, etc.). As shown, a ledge can be relatively narrow (see, e.g., $y_2$ coordinate direction) yet wider than the diameter of a cable. As an example, a ledge may be of a width that is sufficient to accommodate multiple cables. As an example, a ledge can include vents (e.g., some of the various vents 165) where one or more cable clips can be positioned using one or more of the vents. As shown in the example of FIG. 2, vents may be disposed generally in the $y_2$ coordinate direction (e.g., normal to an $x_2$, $z_2$-plane).

As shown in the example of FIG. 2, the cable 300 can be routed to run substantially in a plane that may be parallel to a plane defined by the back side 146 of the display assembly (e.g., consider a plane parallel to the $x_2$, $z_2$-plane). As shown in the example of FIG. 2, a cable clip may be positioned to route the cable 300 at or near the edge 161 and/or the edge 163 such that the cable 300 does not substantially reduce vent area, which may hinder airflow into and/or out of one or more vents.

As an example, a cable clip can be translatable along a vent. For example, consider a rectangular shaped vent where a cable clip may be translated along a long axis of the rectangular shaped vent. In such an example, a cable clip may be attached using one or more vents and then pushed to be closer to an edge (e.g., the edge 161 or the edge 163) to reduce interference between a cable and a vent opening. In such an example, space can be provided to ease installation, for example, to allow a user's finger or fingers to install a cable clip and/or to fit a cable to a cable clip, where after installation, the cable clip and fit cable may be moved (e.g., to reduce vent interference, to move to an edge, etc.). As an example, a cable clip may be slidable in a vent or vents (e.g., translatably slidable), which may facilitate routing one or more cables. As an example, where two cables are routed, one cable clip for a first cable may be positioned at one edge and another cable clip for a second cable may be positioned at another, opposing edge. In such an example, vent space may be relatively unhindered by the two cables for airflow.

A vent can include a vent wall or vent walls that can define a vent dimension. As an example, a vent wall may be defined by a length, a width and a thickness. As an example, a vent can include a repetitive pattern where, for example, adjacent vent openings are substantially of the same dimensions. As an example, a cable clip can include one or more prongs that can be inserted at least partially into a vent opening or vent openings. In such an example, the one or more prongs may be resilient such that they can be elastically deformed to apply a biasing force against a vent wall or vent walls. As an example, one or more prongs may be utilized in a non-elastically deforming manner. For example, consider a prong that has a T-shape that can be inserted into a vent opening and then rotated such that a cross-member of the T-shape is positioned behind two adjacent vent walls. Such an approach may provide for locking a cable clip with respect to a vent or vents. As an example, a cable clip can be relatively small such that it does not act as a substantial obstacle to flow of air into and/or out of a vent or vents.

A magnetic material can be a permanent magnet or a material that is attracted to a magnet such as, for example, a ferromagnetic material. Materials such as iron, nickel and cobalt become magnetized in a magnetic field and can retain some amount of magnetism when the field is removed. As an example, a display assembly may include one or more magnetic materials that can interact with one or more cable clip magnetic materials such that one or more magnetic attraction forces act to couple a cable clip to a display assembly.

As an example, a cable clip can include a display assembly connection portion and a cable connection portion. In such an example, the display assembly connection portion may include one or more prongs and/or one or more magnetic materials. As an example, a cable clip can be adhesiveless such that it does not utilize an adhesive to stick to a display assembly. In various instances, a cable clip can be reusable and repositionable, with or without utilization of a tool. Where a tool is demanded, a cable clip may be somewhat protected from tampering where an individual does not have the appropriate tool.

As an example, a cable connection portion may be an open portion, a closed portion, an openable/closable portion, etc. Where a cable connection portion can open and close, it may include a latch where the latch may be lockable and unlockable. As an example, a latch may be lockable and unlockable in a tool-less manner such that user can manually lock and unlock the latch without a tool. As an example, a latch may be lockable and unlockable using a tool such that manual locking and unlocking cannot be readily performed by an individual.

As an example, a method may include positioning one or more cable clips on a display assembly and then fitting a cable with respect to the one or more cable clips and/or a method may include fitting a cable with respect to one or more cable clips and then positioning the one or more cable clips on a display assembly. As an example, a cable may include one or more cable clips that can be adjustable but not removable. For example, consider the camera assembly 200 as including the cable 300 and one or more cable clips that can have one or more closed cable connection portions where the cable is threaded through the one or more closed cable connection portions. In such an example, the coupled nature may help reduce risk of losing or misplacing the one or more cable clips.

Where a cable clip includes a locking mechanism for locking to a display assembly and a closed or closable/openable locking mechanism for a cable, where the cable is permanently coupled to an accessory, the cable clip can act as an anti-theft feature that reduces risk of removal and theft of the accessory.

As an example, a cable may be routed in part via one or more features of a stand for a display assembly and one or more cable clips coupled to a display assembly. For example, consider routing a cable via a stand mounted cable clip and then routing the cable via one or more display assembly mounted cable clips.

As an example, where one or more cable clips are utilized to manage one or more cables, a display assembly may be adjustable with reduced risk of catching a loop of a cable on an object (e.g., consider one or more of rotations, tilting and height adjustment of a display assembly). For example, catching a cable loop may result in disconnection of the cable (e.g., at a plug end), jerking of the display assembly, etc. As an example, consider a motor-driven stand-up/sit-down desk where cable loop may inadvertently catch on an object during an up and/or down transition. In such an example, the cable may pull on the display assembly and cause it to topple or otherwise be at risk of mechanical damage. A display of a display assembly tends to be relatively fragile and susceptible to physical damage. Further, a cable or cable loop may cause a display assembly to be unbalanced, which may be exacerbated when an accessory is attached to the cable. For example, consider a chain reaction where an accessory falls off the top edge of a display assembly followed by its cable, which then can pull on the display assembly. If the accessory is of a substantial mass and/or experiences free fall for a distance that allows it to gain significantly in momentum, then the chain reaction poses a great risk to the display assembly. Further, the accessory itself may be damaged when it hits the ground, a tabletop, a desktop, etc. Where an accessory has a cable that is couple to a display assembly via one or more cable clips, for example, as in the example of FIG. 2, the accessory itself may be better protected along with the display assembly. For example, if the accessory is knocked off an edge of the display assembly, falling of the accessory may be hindered (e.g., prevented, slowed, etc.) by the one or more cable clips.

As an example, use of one or more cable clips can reduce clutter, reduce cable looping, reduce lose cable draping, improve appearance, improve organization, facilitate servicing, etc. As an example, one or more types of cleaning, servicing, etc., tasks as to a display assembly may be improved where one or more cable clips are utilized. As an example, a rotational transition from a landscape orientation to a portrait orientation and vice versa may be facilitated through utilization one or more cable clips. For example, without cable clips, gravity may cause a cable loop to drape in one direction and, upon transition, the cable loop may drape in a different direction. In such an example, the cable loop may become visible (e.g., clutter), catch an object, cross an object (e.g., another cable, etc.), etc.

As an example, a cable clip may be made from natural rubber, one or more synthetic polymeric materials, etc. As an example, a cable clip may be made from a resilient polymeric material (e.g., natural and/or synthetic) that can be elastically deformed during attachment and/or detachment.

As an example, a cable clip may be snappable such that it can be snapped into place using one or more vent openings. For example, consider a push action that causes one or more prongs to move into a vent opening and then secure against one or more vent wall surfaces. As an example, a cable clip may be attachable in a click-snap manner, where a click occurs as a notification that one or more prongs are appropriately positioned (e.g., snapping into place behind a vent wall, etc.).

As an example, a display assembly may be without vents or without suitable vents. In such an example, one or more magnet cable clips may be utilized. For example, the cable clip 500 can be a bend-shaped magnetic cable clip that allows for clean management of cable around corners, the cable clips 400-1 and 400-2 can be straight magnetic cable clips that allow for directing a cable in a desired direction.

As explained, one or more cable clips can act as anti-theft mechanisms. For example, consider a cable clip that can act as a cable lock utilizing one or more vents to lock a USB accessory to a display assembly to deter theft.

A cable clip may include a closed or openable/closable cable passage (e.g., cable connection portion, cable guide, etc.). In such an example, a closed passage (e.g., a cable guide space) can be too small to allow for passage of a cable connector at an end of a cable. For example, consider a USB cable with a USB type A, B or C connector where a cross-sectional area of a closed passage is too small for the USB type A, B or C connector to pass through the closed passage. As an example, a closed passage, whether permanently closed or openable/closable, may accommodate multiple cables without being able to pass a connector. As to a permanently closed passage, it may be of a cable clip that is permanently fitted to a cable. As to an openable/closable passage, it may be opened to receive one or more cables and then closed to lock the one or more cables in the passage, for example, without providing space sufficient for passage of a connector therethrough.

As mentioned, an accessory can be a cabled accessory such as, for example, a camera, a microphone, a light, etc., which may be mountable on a display assembly. As an example, an accessory may be a pointing device (e.g., a mouse, a trackball, a joystick, etc.), a keyboard, a digitizer tablet, etc. Where such an accessory includes a cable that includes a connector that can be received by a socket of a display assembly, the cable may be managed using one or more cable clips, which can help to deter theft of the accessory.

As an example, one or more cable clips may be utilized with a display assembly that may be in a public setting. For example, consider a kiosk, a library, a school, a shared workplace, etc. In such environments, anti-theft measures can be beneficial to assure usability of accessories associated with workstations that include display assemblies.

As an example, a system can include a display assembly that includes a display, a display side, a back side, a frame and a serial bus socket; and a cable clip, removably attachable to the back side of the display assembly without adhesive, that receives a portion of a cable that includes a serial bus connector receivable by the serial bus socket. For example, consider the display assembly 140 as including the display 142, the display side 144, the back side 146, the frame 150, the socket 167-1 (e.g., and/or one or more other sockets), at least one of the cable clips 400-1, 400-2, 500, 600, and 700, that can be removably attachable to the back side 146 of the display assembly without adhesive. In such an example, at least one of the at least one cable clips 400-1, 400-2, 500, 600 and 700 can receive a cable that includes a connector receivable by the socket 167-1.

Figure 3:
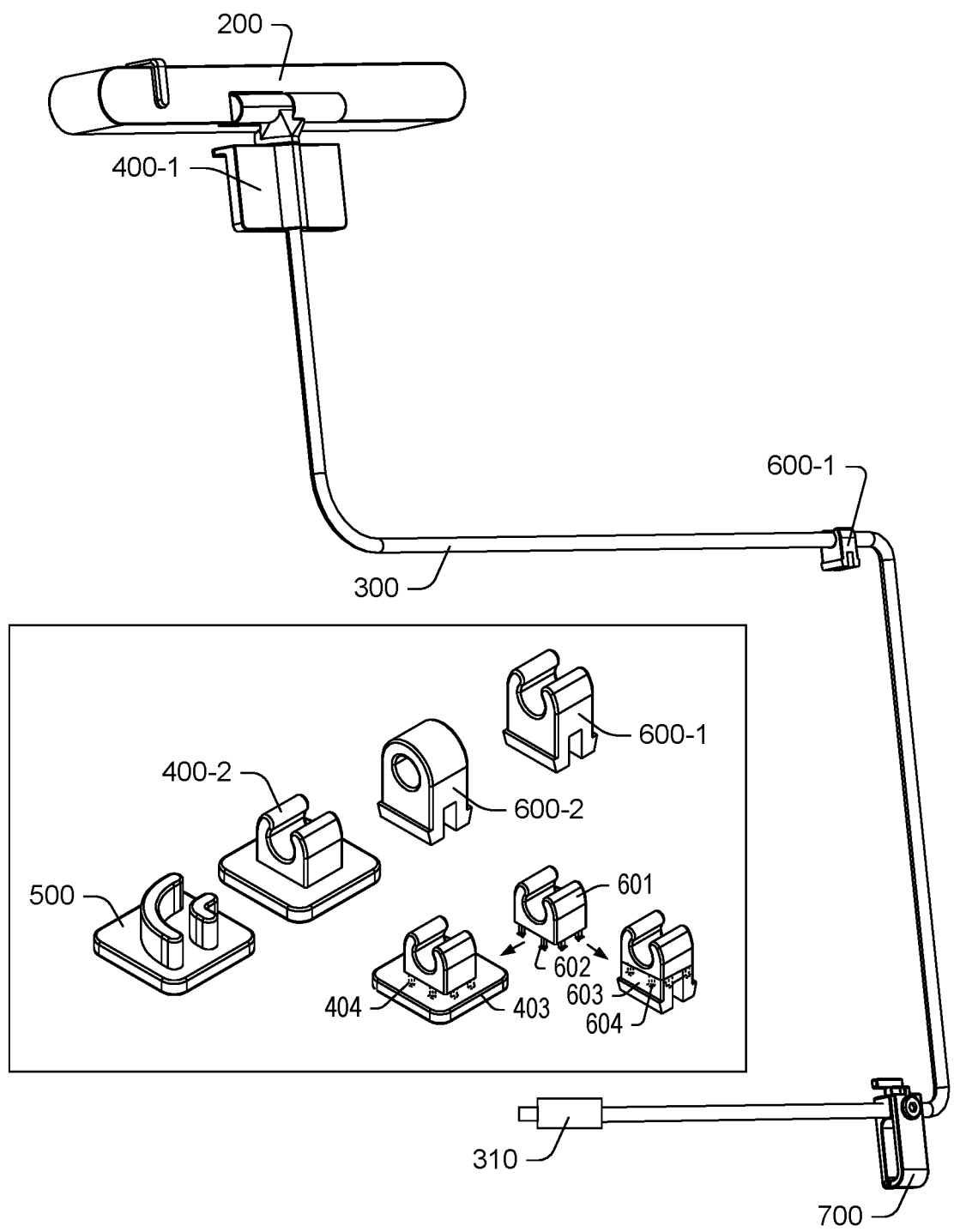
FIG. 3 is a series of perspective views of examples of equipment.

FIG. 3 shows various perspective views of examples of equipment, for example, consider the camera assembly 200, the cable 300 with a cable connector 310, the cable clip 400-1, the cable clip 400-2, the cable clip 500, a cable clip 600-1, a cable clip 600-2, and the cable clip 700.

As shown, the cable clips 400-1, 400-2 and 500 can be magnetic cable clips and the cable clips 600-1, 600-2 and 700 can be vent cable clips. As shown, the cable clip 600-2 has a closed passage and the cable clip 700 has an openable and closable passage. As an example, the cable clip 400-1 can include a resilient flap or flaps that can receive a cable and the cable clips 400-2, 500 and 600-1 can include resilient portions that can elastically deform to receive a cable. As an example, the cable clip 500 can include a radius of a bend (e.g., a bend radius) that is greater than a minimum bend radius of a cable (e.g., a USB cable, etc.).

As shown in FIG. 3, as an example, a cable clip may include a connector portion removably attachable to a back side of a display assembly; and a cable guide portion that receives a portion of a cable that can include a serial bus connector receivable by a serial bus socket of the display assembly. In such an example, the cable clip may be a unitary cable clip. As an example, a cable clip may be a multi-piece cable clip where the connector portion and the cable guide portion are two separate pieces that can be coupled together. For example, consider a permanent coupling or a non-permanent coupling. As an example, a mix and match type of kit may be provided where a cable guide portion can be mated with a magnetic connector portion or with a vent connector portion. As to a coupling mechanism, consider a stem and a socket where the stem may be received by the socket. In such an example, one or more stems and/or one or more sockets may be utilized, which may be features of one or more of the pieces. In a permanent coupling approach, it may provide for preserving anti-theft features of a connector portion as the cable guide portion can be permanently coupled to the connector portion, for example, consider a stem with a pronged head that is received in a socket where substantial force is required to remove the stem. In such an example, the force can exceed approximately 50 N (e.g., consider more than 100 N, etc.). As an example, a USB plug (e.g., male) may be rated with a withdrawal force that is less than 25 N (e.g., consider pulling out a USB plug from a 2 kg laptop computer without having the laptop computer move).

FIG. 3 shows an example cable guide portion 601 and examples of connector portions 403 and 603 where the connector portion 403 can be magnetic and where the connector portion 603 can be for connecting to a vent or vents. As shown, the cable guide portion 601 can include one or more stems 602 and the connector portions can include one or more corresponding sockets 404 and 604 such that the cable guide portion 601 can be mated with the connector portion 403 (e.g., for a magnetic connection cable clip) or the connector portion 603 (e.g., for a vent connection cable clip).

Figure 4:
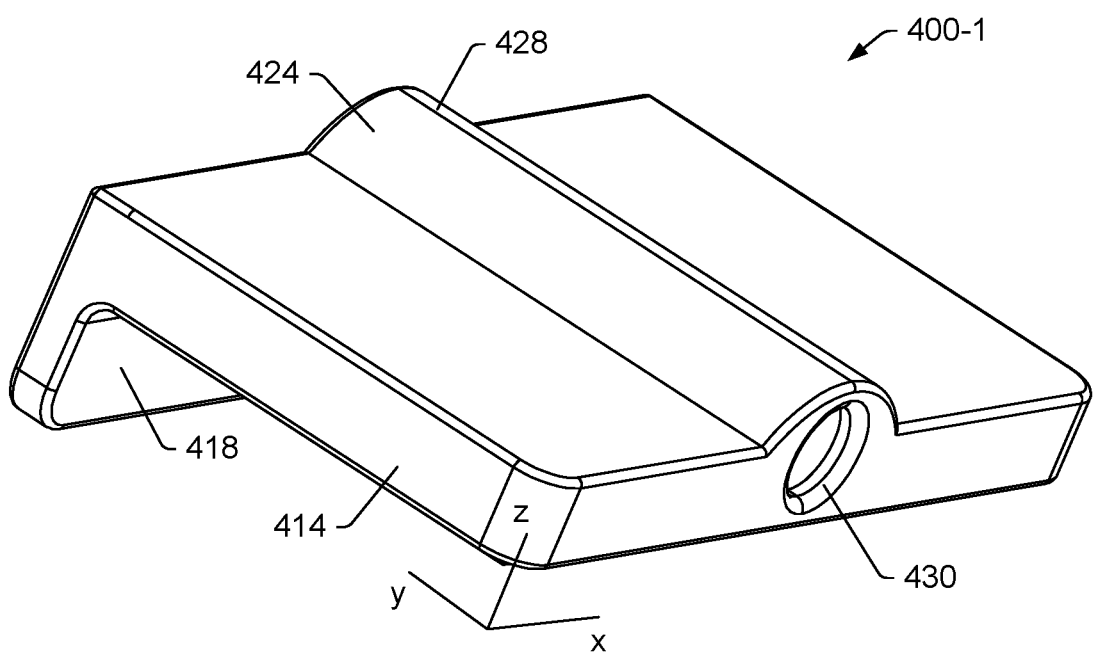
FIG. 4 is a perspective view of an example of a cable clip.

FIG. 4 shows a perspective view of the cable clip 400-1 along with a Cartesian coordinate system x, y and z. As shown, the cable clip 400-1 includes plate portions 414 and 418 that can form a base (e.g., a connector portion) and includes passage forming portions 424 and 428 that form a cable guide portion that can be integral with the plate portion 414 and define a cable passage 430. As shown, the plate portion 414 extends in a direction of the y-axis and the plate portion 418 extends in a direction of the z-axis. The plate portions 414 and 418 define a corner and may be orthogonal (e.g., defined by a 90 degree internal angle). The cable clip 400-1 may be a magnetic cable clip that can be attached to along an edge of a frame of a display assembly. As an example, the passage forming portions 424 and 428 may be fixed or flexible. In a fixed arrangement, the cable passage 430 may be permanently closed and may be fitted to a cable that is coupled to an accessory. As an example, one or more of the plate portions 414 and 418 can be magnetic, for example, consider inclusion of one or more magnetic materials. In such an example, the cable clip 400-1 may connect to a display assembly via a magnetic connection (e.g., a magnetic attraction force).

Figure 5:
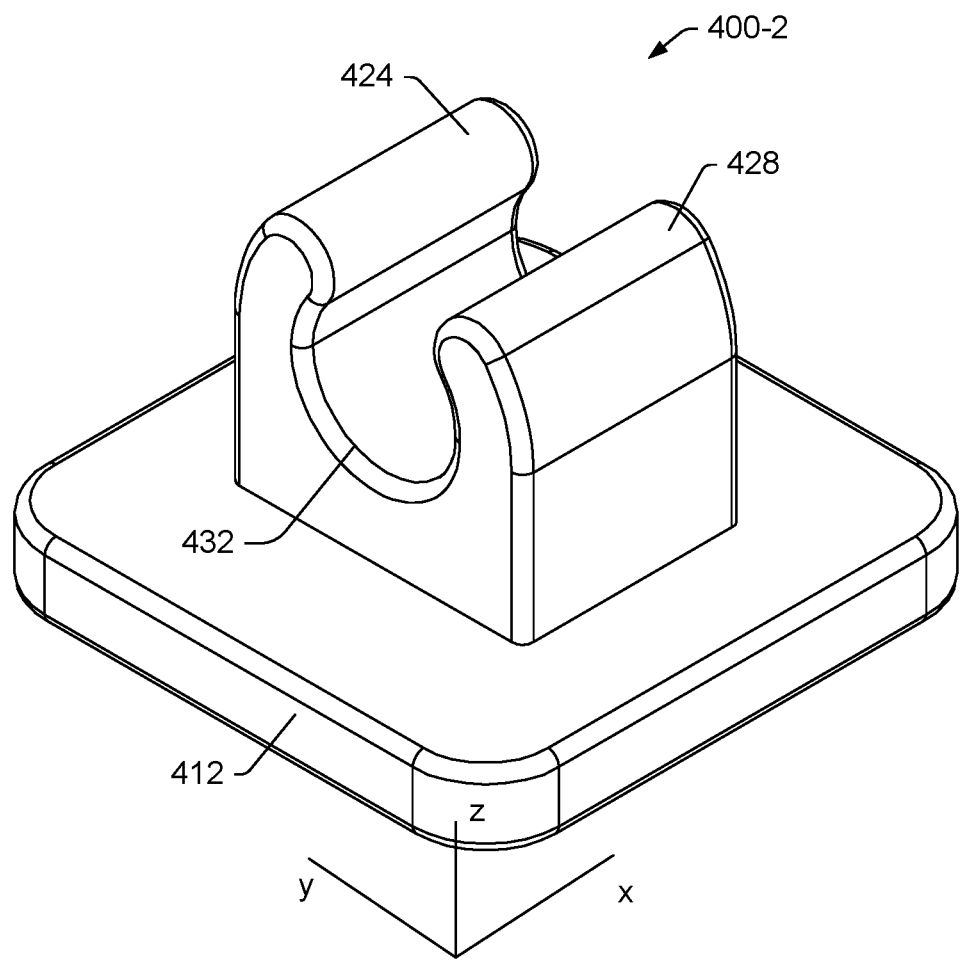
FIG. 5 is a perspective view of an example of a cable clip.

FIG. 5 shows a perspective view of the cable clip 400-2 along with a Cartesian coordinate system x, y and z. As shown, the cable clip 400-2 includes a plate portion 412 (e.g., a base or connector portion) from which an open clamp with opposing clamp portions 424 and 428 extend to define an open cable passage 432 as a cable guide portion. In the example of FIG. 5, the clamp portions 424 and 428 may be integral to the plate portion 412, for example, formed from a single piece of material. As shown, the clamp portions 424 and 428 can define a diameter where, for example, a cable may be received with a slight larger diameter such that an interference fit is established. In such an example, the clamp portions 424 and 428 may be resilient (e.g., spring-like) and allow for press-fitting a cable into an opening defined by ends of the clamp portions 424 and 428. The cable clip 400-2 may be a magnetic cable clip that can be attached to along a surface of a display assembly. For example, the plate portion 412 can include one or more magnets (e.g., one or more permanent magnets).

Figure 6:
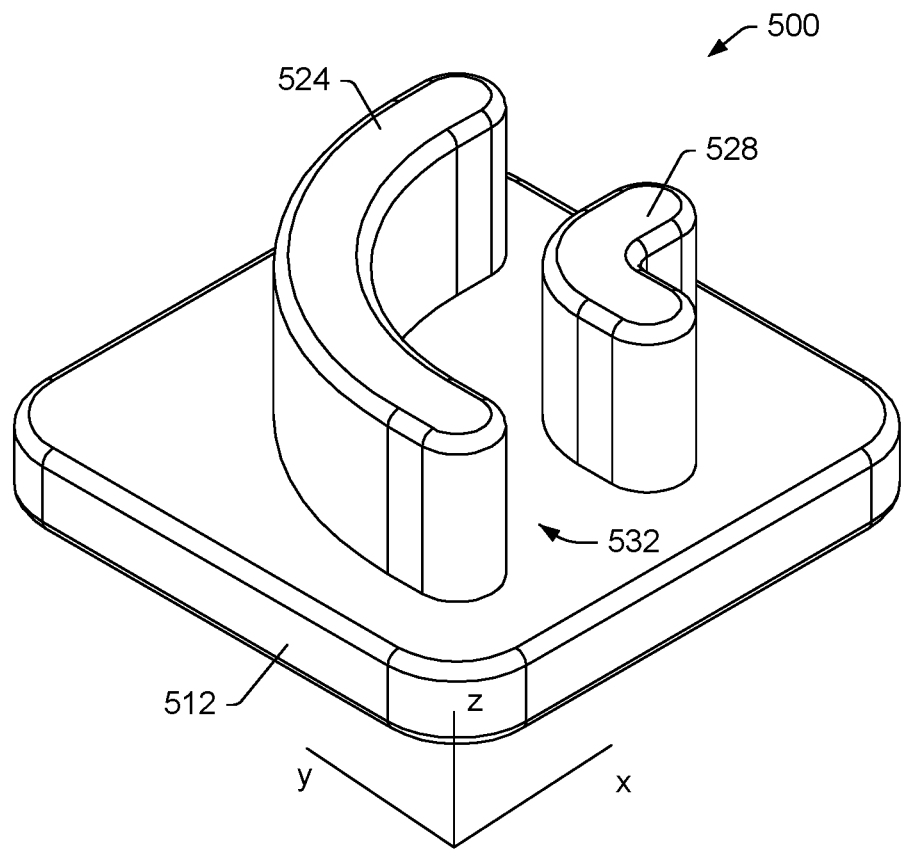
FIG. 6 is a perspective view of an example of a cable clip.

FIG. 6 shows a perspective view of the cable clip 500 along with a Cartesian coordinate system x, y and z. As shown, the cable clip 500 includes a plate portion 512 (e.g., a base or connector portion) from which an open clamp with opposing clamp portions 524 and 528 extend to define an open cable passage 532 of a cable guide portion. In the example of FIG. 6, the clamp portions 524 and 528 may be integral to the plate portion 512, for example, formed from a single piece of material. As an example, the clamp portions 524 and 528 may be resilient such that a cable can be interference fit into a slot defined by the clamp portions 524 and 528 where the slot may be curved such as curved by approximately 90 degrees (e.g., or 45 degrees, etc.). The cable clip 500 may be a magnetic cable clip that can be attached to along a surface of a display assembly. For example, the plate portion 512 can include one or more magnets (e.g., one or more permanent magnets). As an example, the clamp portions 524 and 528 can include stems and/or sockets and the base portion 512 can include sockets and/or stems. For example, consider two stem-socket connections for each of the clamp portions 524 and 528.

Figure 7:
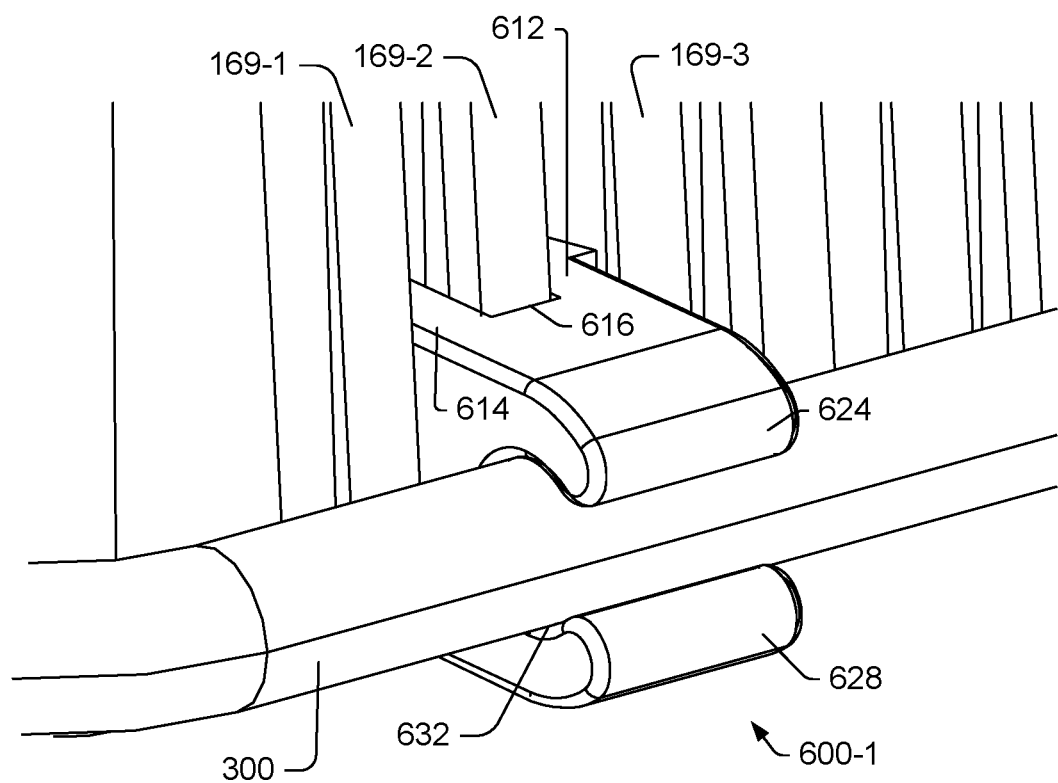
FIG. 7 is a perspective view of an example of a cable clip and an example of a portion of a display assembly.

FIG. 7 shows a perspective view of an example of the cable clip 600-1 with respect to a portion of a display assembly that includes a series of vent walls 169-1, 169-2 and 169-3. As shown, the cable clip 600-1 includes prongs 612 and 614 that are disposed in respective vent openings defined by the vent walls 169-1 and 169-2 and the vent walls 169-2 and 169-3, respectively. The prongs 612 and 614 can be part of a connector portion of the cable clip 600-1. As shown, the prongs 612 and 614 are spaced apart to define a recess 616 that can receive the vent wall 169-2. The cable clip 600-1 includes clamp portions 624 and 628 that form an open cable passage 632 of a cable guide portion of the cable clip 600-1. As shown, the clamp portions 624 and 628 can define a diameter where, for example, a cable may be received with a slight larger diameter such that an interference fit is established. In such an example, the clamp portions 624 and 628 may be resilient (e.g., spring-like) and allow for press-fitting a cable into an opening defined by ends of the clamp portions 624 and 628. As shown in the example of FIG. 7, the cable 300 and the open cable passage 632 are horizontal while the vent walls 169-1, 169-2 and 169-3 are vertical; thus, the cable 300 runs anti-parallel to the direction of the longitudinal direction of the vent walls 169-1, 169-2 and 169-3 and corresponding vent openings.

As explained, a cable clip may be movable while seated in one or more vent openings. For example, consider the cable clip 600-1 as being movable with or without the cable 300 seated via the clamp portions 624 and 628 of the cable clip 600-1 (e.g., to move toward an edge, a surface, an end of a vent, etc.).

As explained with respect to the example of FIG. 2, a display assembly can include a bump out or housing that extends outwardly from a back side of the display assembly to define a ledge or ledges. Where the ledge or ledges include vent walls that extend in the outward direction, the cable clip 600-1 can provide for running a cable along the ledge or ledges. As explained, a cable may be positioned using one or more cable clips to be at an edge or an end of one or more vent openings such that the cable's impact on airflow into and/or out of the one or more vent openings is reduced.

As an example, where a ledge includes vent walls that run lengthwise along the ledge, a cable clip may include a different arrangement of features such that a cable passage is oriented in the lengthwise direction such that a cable can be fitted to the cable clip to run in the lengthwise direction.

Figure 8:
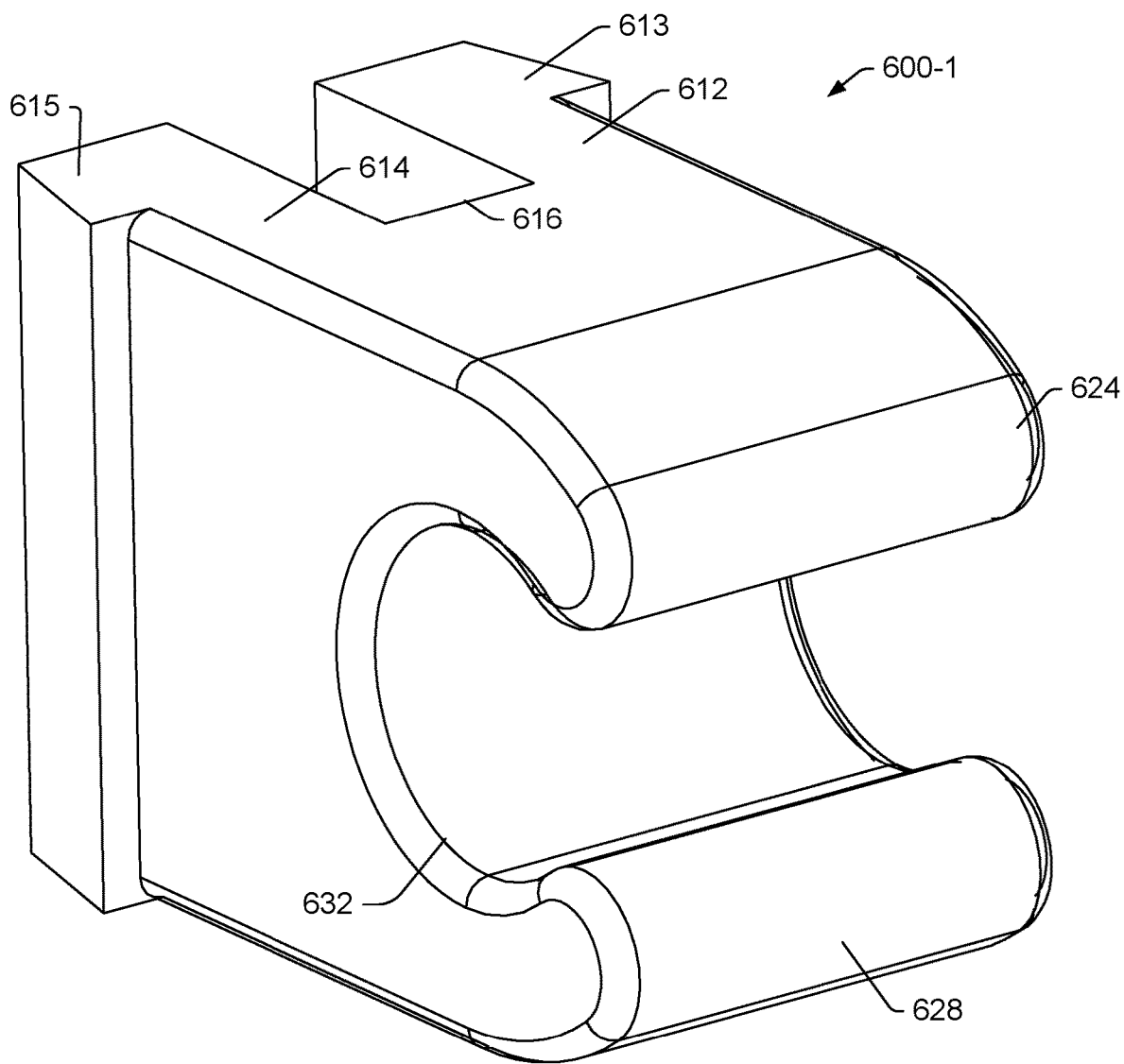
FIG. 8 is a perspective view of an example of a cable clip.

FIG. 8 shows a perspective view of the cable clip 600-1 where the prongs 612 and 614 include end extensions 613 and 615, respectively. In such an example, the recess 616 can be dimensioned to be larger than a vent wall thickness such that the prongs 612 and 614 can move toward each other as they are pushed into respective vent openings such that the end extensions 613 and 615 move inwardly. In such an example, once the end extensions 613 and 615 clear the vent well (e.g., vent wall depth), the prongs 612 and 614 can expand outwardly such that the end extensions 613 and 615 snap resiliently behind respective vent walls to secure the cable clip 600-1 to a display assembly.

As shown in the example of FIG. 8, the cable clip 600-1 can be relatively compact in size. For example, the cable clip 600-1 can have a footprint that is approximately the size of the clamp portions 624 and 628 (e.g., cable guide portion), which may help to reduce disturbance of airflow into and/or out of a vent.

Figure 9:
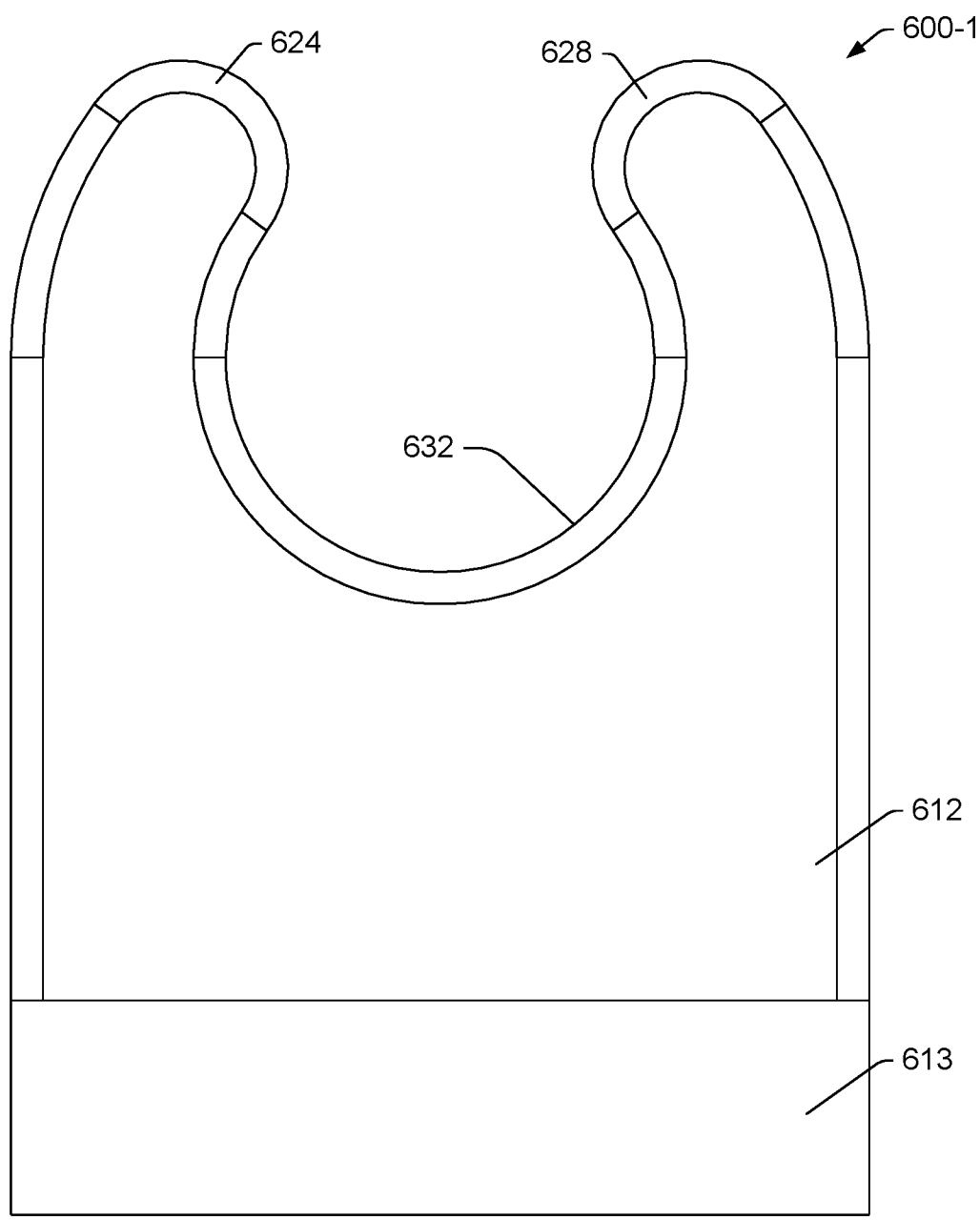
FIG. 9 is a side view of the cable clip of FIG. 8.

FIG. 9 shows a side view of the cable clip 600-1. As shown, the clamp portions 624 and 628 can be horn-shaped to define an approximately circular open cable passage 632. As explained, the clamp portions 624 and 628 may be resilient (e.g., spring-like) such that a cable can be pushed between the clamp portions 624 and 628 to be seated in the approximately circular open cable passage 632.

Figure 10:
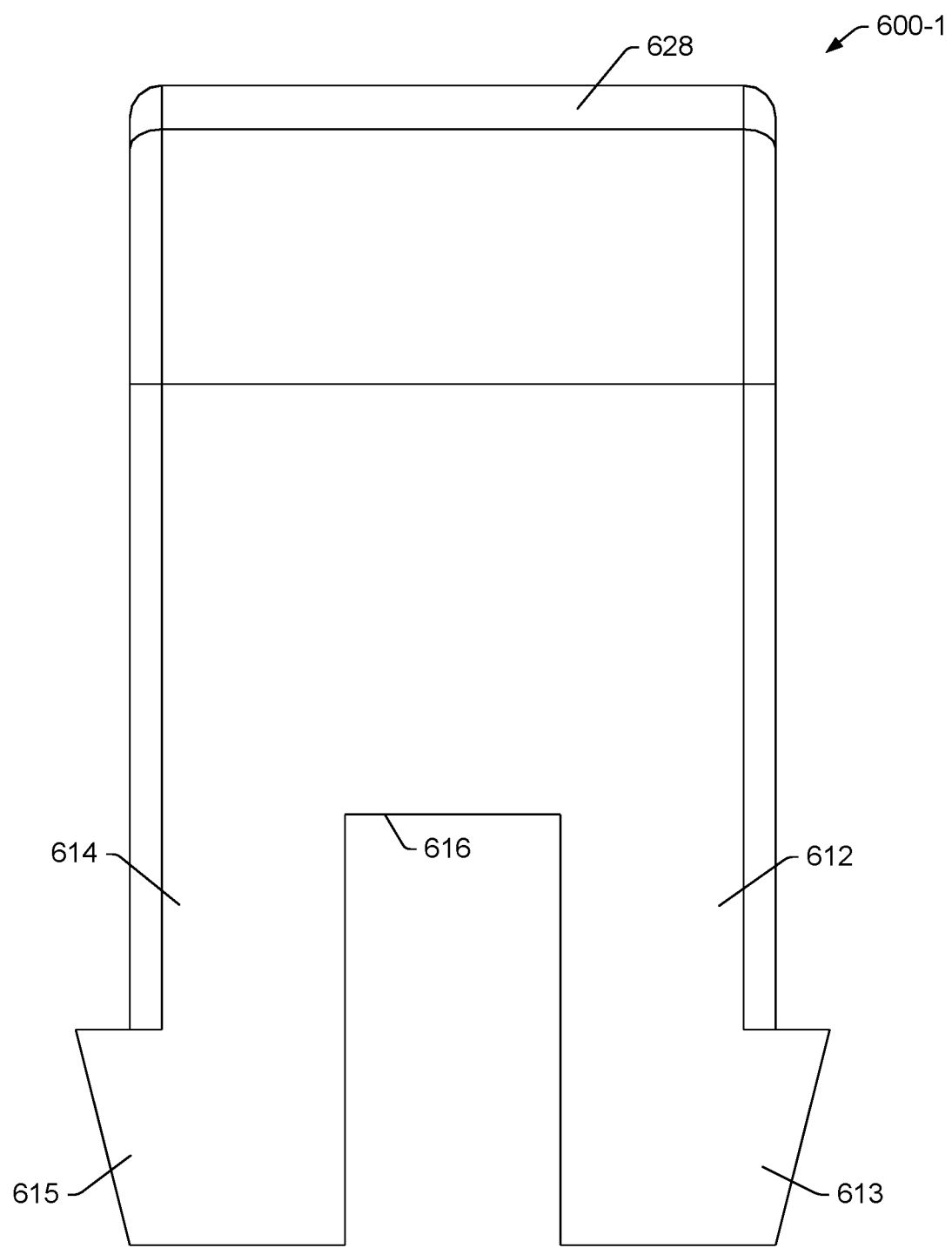
FIG. 10 is another side view of the cable clip of FIG. 8.

FIG. 10 shows another side view of the cable clip 600-1 where sizes of the prongs 612 and 614 along with the recess 616 can be discerned. As explained, as an example, the recess 616 may be sized slightly larger than a vent wall. As an example, the end extensions 613 and 615 may be made of an elastic material that is elastically deformable to compress in size such that the end extensions 613 and 615 can be pressed into a respective vent openings defined by vent walls. In such an example, the Young's modulus of the material of the end extensions 613 and 615 can be less than the Young's modulus of material of vent walls, which can help reduce the risk of bending or otherwise deforming a vent wall. For example, consider utilizing a material for a cable clip that is elastically deformable to a greater extent than a material of a vent wall. Such an approach can help to reduce risk of plastic deformation of a vent wall or vent walls.

Some examples of materials are given below in Table 1 for thermoplastics and in Table 2 for thermosetting plastics.

TABLE 1

Some example thermoplastics.

| Thermoplastics | Density kg/m$^3$ | Tensile MPa | Elonga- tion % | Young's GPa | Brinell No. |
|---|---|---|---|---|---|
| ABS | | | | | |
| Acrylic (metacrylate) | 1190 | 74 | 6 | 3 | 34 |
| Cellulose Acetate | 1300 | 40 | 10-60 | 1.4 | 12 |
| Cellulose Nitrate | 1350 | 48 | 40 | 1.4 | 10 |
| Nylon | 1160 | 60 | 90 | 2.4 | 10 |
| Polyethylene | 950 | 20-30 | 20-100 | 0.7 | 2 |
| Polycarbonate | | | | | |
| Polyethermide | | | | | |
| Polyethylene | | | | | |
| Polyimide | | | | | |
| Polypropylene | 900 | 27 | 200-700 | 1.3 | 10 |
| Polystyrene | 1050 | 48 | 3 | 3.4 | 25 |
| PTFE (fluoropolymer) | 2100 | 13 | 100 | 0.3 | |
| PVC | 1330 | 48 | 200 | 3.4 | 20 |

TABLE 2

Some example thermosetting plastics.

| Thermosetting Plastics | Density kg/m$^3$ | Tensile MPa | Elonga- tion % | Young's GPa | Brinell No. |
|---|---|---|---|---|---|
| Acetals, glass filled | 1600 | 58-75 | 2-7 | 7 | 27 |
| Allyl | | | | | |
| Epoxy resin, glass filled | 1600-2000 | 68-200 | 4 | 20 | 38 |
| Melamine formaldehyde, fabric filled | 1800-2000 | 60-90 | | 7 | 38 |
| Phenol formaldehyde, mica filled (phenolic) | 1600-1900 | 38-50 | 0.5 | 17-35 | 36 |
| Polyurethane | | | | | |
| Silicone | | | | | |
| Urea formaldehyde, cellulose filled | 1500 | 38-90 | 1 | 7-10 | 51 |

As to some examples of elastomers, consider one or more of butyl rubber, chloroprene, neoprene, ethylene-propylene, fluorinated copolymers, isoprene, natural rubber, nitrile, Buna N, polysulfide, polyurethane, PVC and silicone copolymer. Such elastomers can have Young's modulus values that are less than 1 GPa. For example, natural rubber may have a Young's modulus in a range of approximately 0.01 GPa to 0.1 GPa. As set forth in Table 1, some polyethylene (PE) polymeric materials can have a Young's modulus less than 1 GPa. For example, low-density PE may have a Young's modulus of approximately 0.23 GPa; whereas, high-density PE may be closer to 1 GPa or more.

As to a material of a shell of a display assembly, which may include vent walls, it may be selected based on operational conditions such as temperature. Thermoplastics can generally be softened when heated and tend to be less rigid than thermosetting plastics yet they tend to be rougher. Thermosetting plastics undergo a chemical change during molding such that softened upon reheating does not occur or is quite limited. Thermosetting plastics tend to be harder and more brittle than thermoplastic materials.

As an example, a cable clip material can be elastically deformable and of a lesser Young's modulus than a vent wall material. In such an example, force applied to a cable clip may elastically deform with reduced risk of plastic deformation (e.g., irreversible damage) to one or more vent walls. As an example, a cable clip may be elastically deformable for insertion into and removal from one or more vent openings defined by corresponding vent walls with reduced risk of damage to the corresponding vent walls.

Figure 11:
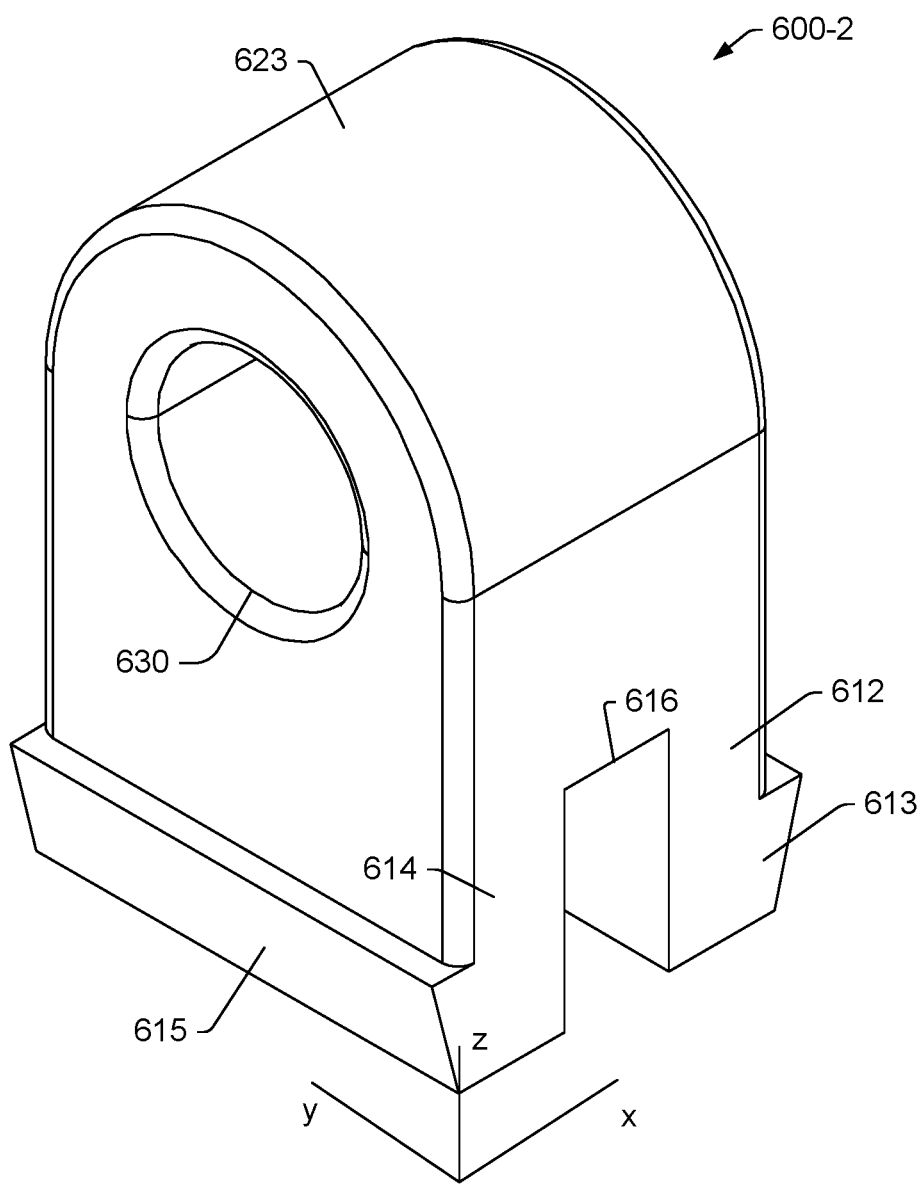
FIG. 11 is a perspective view of an example of a cable clip.

FIG. 11 shows a perspective view of the cable clip 600-2 along with a Cartesian coordinate system x, y and z. As shown, the cable clip 600-2 includes the prongs 612 and 614 and respective end extensions 613 and 615 of a connector portion of the cable clip 600-2. As shown, the prongs 612 and 614 are spaced apart to define the recess 616 that can receive a vent wall. The cable clip 600-2 includes a clamp portion 623 that forms a closed cable passage 630 of a cable guide portion of the cable clip 600-2. As an example, the cable clip 600-2 may be fitted to a cable before a cable connector and/or an accessory is fit to the cable. The cable clip 600-2 may be referred to as a permanent cable clip with respect to a cable as removable from a cable would involve removing a component from an end of the cable (e.g., detaching the component, cutting the cable, etc.). As an example, the cable clip 600-2 may be movable along a length of a cable such that it can be positioned as desired, for example, with respect to a vent or vents.

Figure 12:
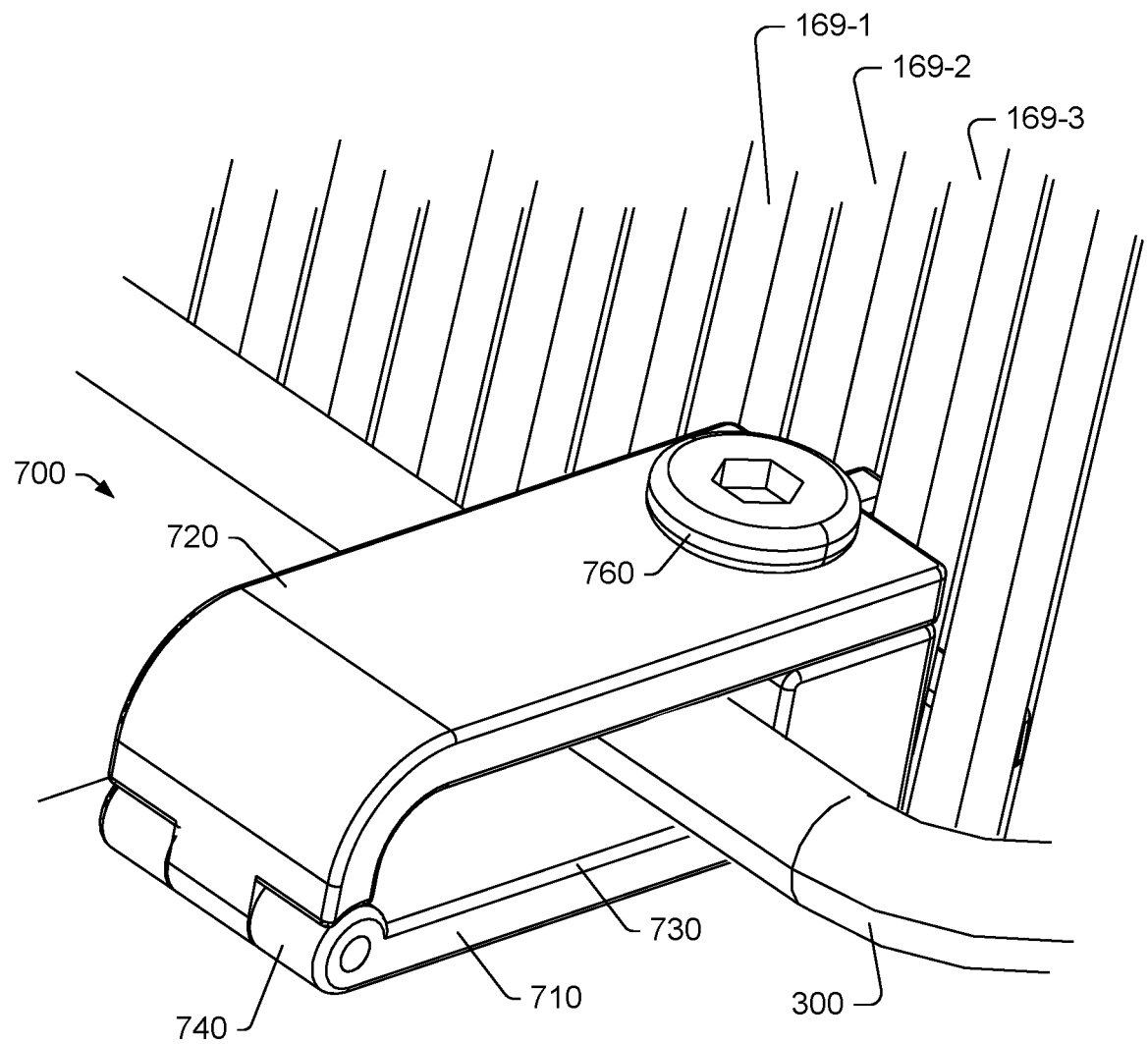
FIG. 12 is a perspective view of an example of a cable clip and an example of a portion of a display assembly.

FIG. 12 shows a perspective view of the cable clip 700, a cable 300 and a portion of a display assembly with vent walls 169-1, 169-2 and 169-3. As shown, the cable clip 700 includes a clamshell configuration with clamp portions 710 and 720 that can define a cable passage 730 of a cable guide portion of the cable clip 700 where the clamp portions 710 and 720 are coupled via a hinge assembly 740. As shown, the cable clip 700 can include a bolt 760 that includes tool features such as internal flats and/or external flats. In the example of FIG. 12, the bolt 760 includes internal flats arranged to form a hexagon such that a hex wrench may be utilized to rotate the bolt 760. As an example, the cable clip 700 may be movable in a longitudinal direction of the vent walls 169-1, 169-2 and 169-3. For example, consider moving upwardly or moving downwardly (e.g., translatably movable) in the view of FIG. 12. As explained, a movable cable clip may provide for ease of installation, cable clipping, moving toward an edge, etc.

In the example of FIG. 12, when the bolt 760 is tightened to secure the clamp portion 720 to the clamp portion 710, the cable 300 can be secured to a display assembly. As an example, the cable passage 730 may be sized to accommodate one or more cables and may be sized to prohibit passage of a cable connector when the clamp portions 710 and 720 are in a closed position.

Figure 13:
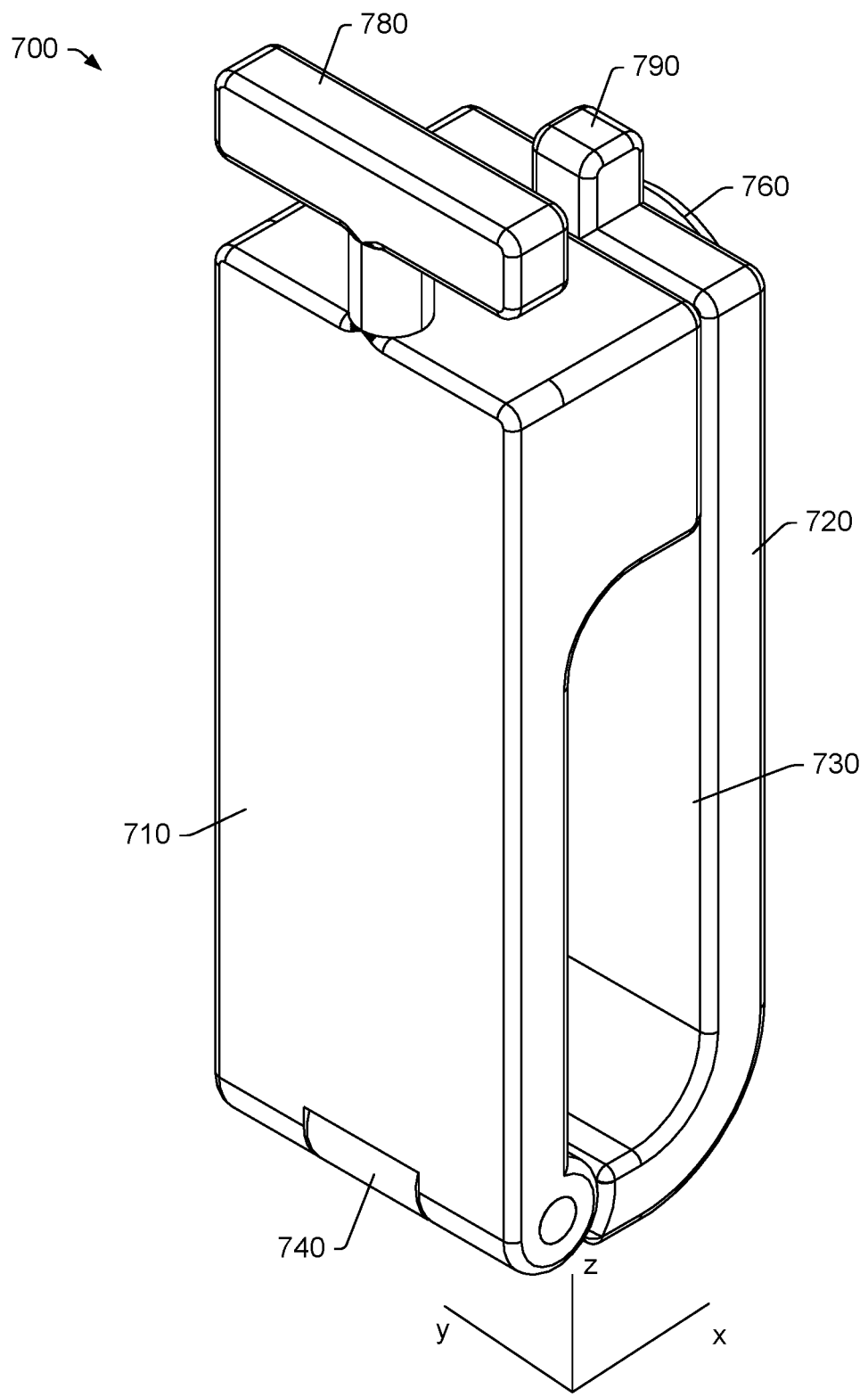
FIG. 13 is a perspective view of an example of a cable clip.

FIG. 13 shows a perspective view of the cable clamp 700 along with a Cartesian coordinate system x, y and z. As shown, the clamp portion 710 can include a connector portion such as a T-shaped extension 780 defined by an axial member and a cross-member and the clamp portion 720 can include an extension 790. As an example, with the clamp portion 720 rotated outwardly via the hinge assembly 740, the T-shaped extension 780 as a connector portion can be inserted into a vent opening defined by two adjacent vent walls and then the cable clip 700 can be rotated by approximately 90 degrees. Once rotated, ends of the cross-member of the T-shaped extension 780 can be seated behind the two adjacent vent walls and, for example, the clamp portion 710 may be set against a surface such as a back surface (e.g., a back side) of a display assembly, which may help to reduce interference with vent airflow. Next, one or more cables may be positioned with respect to the clamp portion 710 and the clamp portion 720 rotated to close the passage 730. In such an example, the extension 790 can help guide the clamp portion 720 where the extension can be received in the same vent opening as the T-shaped extension 780 where the extension 790 can act as an anti-rotation feature such that the T-shaped extension 780 cannot be rotated for purposes of removal. Once closed, the bolt 760 may be tightened to lock the clamp portion 720 to the clamp portion 710 with the one or more cables positioned in the cable passage 730. As explained, such an approach can provide for organization and/or anti-theft management.

Figure 14:
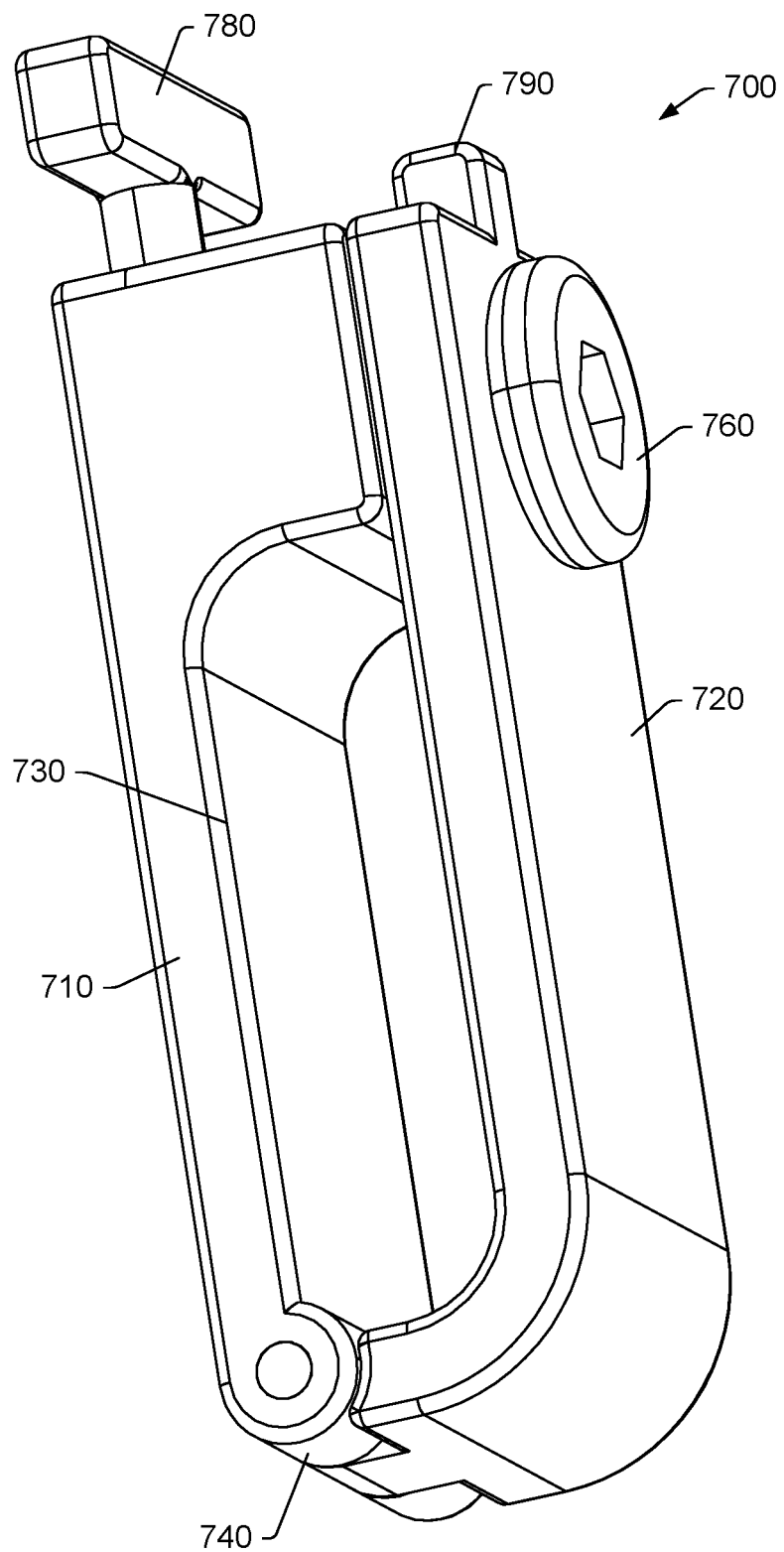
FIG. 14 is a perspective view of the cable clip of FIG. 13.

FIG. 14 shows another perspective view of the cable clamp 700 where the T-shaped extension 780 and the extension 790 are shown. As explained, the T-shaped extension 780 can be inserted in a vent opening and rotated such that the cross-member is received behind vent walls that define the vent opening where the extension 790 can be received in the same vent opening as an anti-rotation feature such that the cable clip 700 is not rotatable in a manner that would allow for removal of the T-shaped extension 780 from the vent opening. For example, the extension 780 is not aligned with the rotational axis of the T-shaped extension 780 as defined by the axial member of the T-shape. As such, with the two extensions 780 and 790 received in a vent opening or vent openings, the cable clip 700 is secured and not removable.

Figure 15:
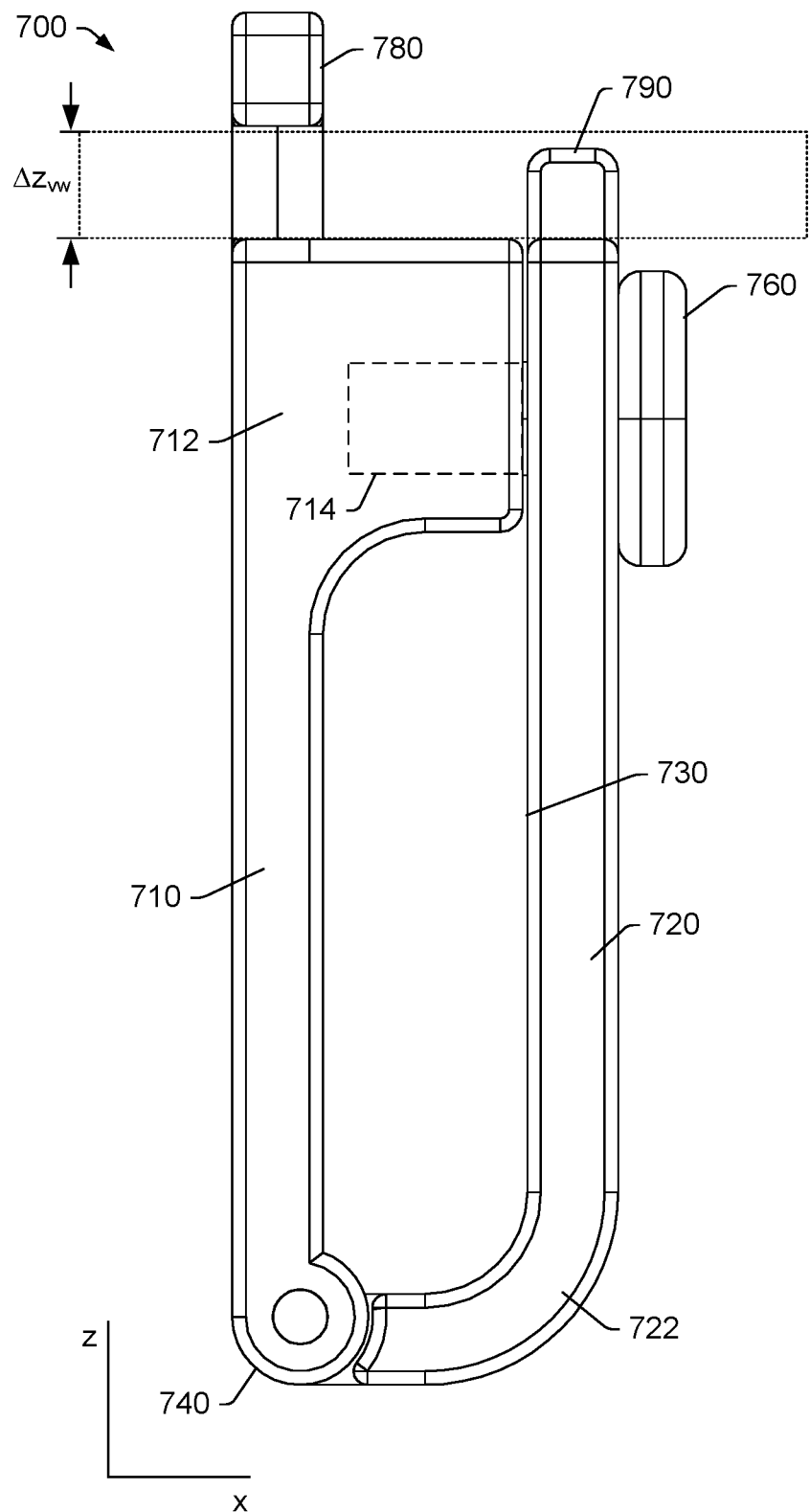
FIG. 15 is a side view of the cable clip of FIG. 13.

FIG. 15 shows a side view of the cable clip 700 along with an x, z coordinate system. As shown, the clamp portion 710 includes a boss 712 that includes a bore 714 that can receive a stem of the bolt 760. In such an example, the bore 714 and the bolt 760 can include mating threads. As shown, the clamp portion 720 includes a bend, which may be, for example, a 90 degree bend.

FIG. 15 also shows a dotted block that can represent a vent wall with a depth $\Delta z_{vw}$ along a direction of the z-axis. As shown, the extension 780 can be of a length that is greater than the depth of the vent wall such that the cross-member can reach behind the vent wall. Further, as shown, the extension 790 can be of a length that is at least one-third of the depth of the vent wall such that it can act as an anti-rotation feature with respect to one or more vent walls. As explained, the extension 780 can be a of a width along a direction of the x-axis that is less than a vent opening width as defined between adjacent vent walls. Such an approach can allow for insertion of the extension 780 into a vent opening followed by rotation of the extension 780. Where the extension 790 is inserted as an anti-rotation feature, the cable clip 700 may be translatable (e.g., to move along a longitudinal vent direction).

As an example, a system can include a display assembly that includes a display, a display side, a back side, a frame and a serial bus socket; and a cable clip, removably attachable to the back side of the display assembly, that receives a portion of a cable that includes a serial bus connector receivable by the serial bus socket. In such an example, the system can include the cable where, for example, the cable is operatively coupled to an accessory mountable to the frame of the display assembly. As an example, a cable clip may be removably attachable to a back side of a display assembly without adhesive (e.g., between the cable clip and the display assembly).

As an example, a cable clip can be a unitary component. For example, consider a molded component made via injection molding. As an example, a material of construction can be a polymeric material that can be elastically deformable, which may be characterized via a Young's modulus value. For example, consider a polymeric material with a Young's modulus value less than approximately 10 GPa or less than approximately 5 GPa or less than approximately 1 GPa.

As an example, a display assembly can include vent openings where, for example, a cable clip includes at least one prong receivable in at least one of the vent openings. In such an example, a prong can be an extension such as, for example, an extension with a T-shaped portion (e.g., a T-shaped prong or extension, etc.). In such an example, the T-shape can be formed by an axial extension with a cross-member. As an example, a T-shaped portion can include a width that is greater than a vent opening width and a thickness that is less than the vent opening width. In such an example, the T-shaped portion can include a length that is greater than a vent opening wall depth. For example, consider an arrangement of features where rotation of a T-shaped portion lock a cable clip with respect to at least one vent opening of a display assembly.

As an example, a cable clip can include a rotatable clamp portion such as a rotatable clasp. In such an example, the cable clip can include a clasp lock, which may include a bolt (e.g., a screw, etc.). As shown in FIG. 15, a cable clip can include clamp portions where the clamp portions can be clamshell portions where a bolt can provide for securing one clamp portion with respect to another clamp portion. In such an example, one of the clamp portions can be a clasp rotatable via a hinge assembly and the bolt can be part of a clasp lock. As an example, a bolt can include a tool feature. As an example, a clasp lock may be operable with a tool or may be operable without a tool. In a tool-less approach, a user may utilize a hand to lock and unlock the clasp lock; whereas, in a tool-based approach, a user may have to possess an appropriate tool to lock and unlock the clasp lock. As to a tool-less approach, consider a wing bolt where one or more wings are graspable by a human hand. As to a tool-based approach, consider utilization of flats such as internal and/or external flats, which may be arranged for contact with a standardized tool (e.g., a hex pattern, a TORX pattern, etc.) or a customized tool (e.g., for purposes of enhanced security).

As an example, in a closed position, a rotatable clasp can define a cable guide space such as a cable passage. In such an example, the cable guide space (e.g., cable passage) can be sized to prevent passage of a cable serial bus connector. In such an example, a cable clip can act as an anti-theft feature for an accessory and/or a cable.

As an example, a display assembly can include vent openings and a cable clip can include prongs where each of the prongs is receivable in at least one of the vent openings. In such an example, the prongs can include at least one resilient prong that can apply a biasing force to at least one vent wall that defines at least one of the vent openings.

As an example, a display assembly can include a magnetic material and a cable clip can include at least one magnet that generates a magnetic attraction force with respect to the magnetic material. In such an example, the cable clip can include a straight cable guide and/or a curved cable guide. As an example, a curved cable guide can include a 90 degree curve.

As an example, a cable clip can include a base with plate portions that are joined to define a bend. In such an example, the cable clip may be fit at a corner of a display assembly (e.g., along an edge, etc.).

As an example, a cable clip can include a connector portion removably attachable to a back side of a display assembly; and a cable guide portion that receives a portion of a cable that includes a serial bus connector receivable by a serial bus socket of the display assembly. In such an example, the connector portion may be a base that provides for attachment to a display assembly while the cable guide portion extends from the base for fitting a cable, which may be permanently fit or removably fit (e.g., consider a closed cable guide portion, an open cable guide portion or an openable and closable cable guide portion).

As an example, a cable clip can be a unitary component. For example, consider a molded component formed of polymeric material where the polymeric material.

As an example, a connector portion of a cable clip can include a prong receivable in at least one vent opening of a back side of a display assembly. In such an example, the prong can include a T-shaped portion. For example, consider a T-shaped portion with a width that is greater than a vent opening width, a thickness that is less than the vent opening width, a length that is greater than a vent opening wall depth. In such an example, rotation of the T-shaped portion can provide for locking the cable clip with respect to at least one vent opening of a back side of a display assembly.

As an example, a cable clip can include a rotatable clasp and a clasp lock, where, in a closed position, the rotatable clasp defines a cable guide space of the cable guide portion. As explained, a cable guide space of such a cable clip can be sized to prevent passage of a cable serial bus connector such that the cable clip can act as an anti-theft feature.

As an example, a cable clip can include a connector portion that includes prongs, for example, where each of the prongs is receivable in at least one of vent opening of a back side of a display assembly.

As an example, a connector portion of a cable clip can include at least one magnet that generates a magnetic attraction force with respect to magnetic material (e.g., of a back side of a display assembly).

As an example, a cable clip can include a cable guide portion that includes a curved cable guide. For example, consider two curved walls where a cable may be received between the two curved walls.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 16:
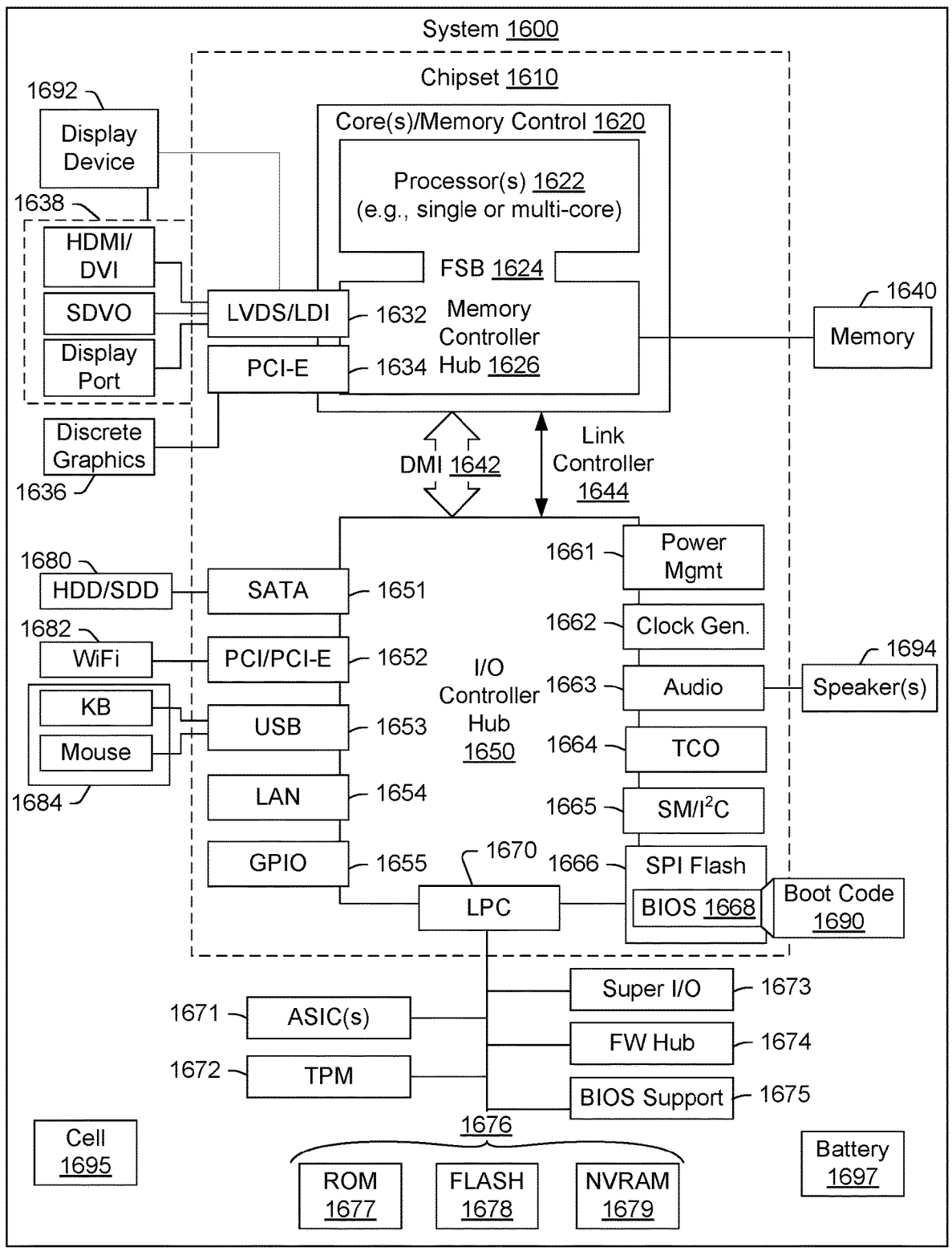
FIG. 16 is a diagram of an example of a system.

While various examples of circuits or circuitry have been discussed, FIG. 16 depicts a block diagram of an illustrative computer system 1600. The system 1600 may be a computer system sold by Lenovo (US) Inc. of Morrisville, NC (e.g., a THINKSTATION® system, etc.); however, as apparent from the description herein, a satellite, a base, a display, a computing device, a server or other machine may include one or more features and/or other features of the system 1600.

As an example, a monitor or display may include features such as one or more of the features included in one of the LENOVO® IDEACENTRE® or THINKCENTRE® "all-in-one" (AIO) computing devices (e.g., sold by Lenovo (US) Inc. of Morrisville, NC). For example, the LENOVO® IDEACENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 16, the system 1600 includes a so-called chipset 1610. A chipset refers to a group of integrated circuits, or chips, that are designed to work together. Chipsets are usually marketed as a single product (e.g., consider chipsets marketed under the brands INTEL®, AMD®, etc.).

In the example of FIG. 16, the chipset 1610 has a particular architecture, which may vary to some extent depending on brand or manufacturer. The architecture of the chipset 1610 includes a core and memory control group 1620 and an I/O controller hub 1650 that exchange information (e.g., data, signals, commands, etc.) via, for example, a direct management interface or direct media interface (DMI) 1642 or a link controller 1644. In the example of FIG. 16, the DMI 1642 is a chip-to-chip interface (sometimes referred to as being a link between a "northbridge" and a "southbridge").

The core and memory control group 1620 include one or more processors 1622 (e.g., single core or multi-core) and a memory controller hub 1626 that exchange information via a front side bus (FSB) 1624. As described herein, various components of the core and memory control group 1620 may be integrated onto a single processor die, for example, to make a chip that supplants the conventional "northbridge" style architecture.

The memory controller hub 1626 interfaces with memory 1640. For example, the memory controller hub 1626 may provide support for DDR SDRAM memory (e.g., DDR, DDR2, DDR3, etc.). In general, the memory 1640 is a type of random-access memory (RAM). It is often referred to as "system memory".

The memory controller hub 1626 further includes a low-voltage differential signaling interface (LVDS) 1632. The LVDS 1632 may be a so-called LVDS Display Interface (LDI) for support of a display device 1692 (e.g., a CRT, a flat panel, a projector, etc.). A block 1638 includes some examples of technologies that may be supported via the LVDS interface 1632 (e.g., serial digital video, HDMI/DVI, display port). The memory controller hub 1626 also includes one or more PCI-express interfaces (PCI-E) 1634, for example, for support of discrete graphics 1636. Discrete graphics using a PCI-E interface has become an alternative approach to an accelerated graphics port (AGP). For example, the memory controller hub 1626 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1650 includes a variety of interfaces. The example of FIG. 16 includes a SATA interface 1651, one or more PCI-E interfaces 1652 (optionally one or more legacy PCI interfaces), one or more USB interfaces 1653, a LAN interface 1654 (more generally a network interface), a general purpose I/O interface (GPIO) 1655, a low-pin count (LPC) interface 1670, a power management interface 1661, a clock generator interface 1662, an audio interface 1663 (e.g., for speakers 1694), a total cost of operation (TCO) interface 1664, a system management bus interface (e.g., a multi-master serial computer bus interface) 1665, and a serial peripheral flash memory/controller interface (SPI Flash) 1666, which, in the example of FIG. 16, includes BIOS 1668 and boot code 1690. With respect to network connections, the I/O hub controller 1650 may include integrated gigabit Ethernet controller lines multiplexed with a PCI-E interface port. Other network features may operate independent of a PCI-E interface.

The interfaces of the I/O hub controller 1650 provide for communication with various devices, networks, etc. For example, the SATA interface 1651 provides for reading, writing or reading and writing information on one or more drives 1680 such as HDDs, SDDs or a combination thereof. The I/O hub controller 1650 may also include an advanced host controller interface (AHCI) to support one or more drives 1680. The PCI-E interface 1652 allows for wireless connections 1682 to devices, networks, etc. The USB interface 1653 provides for input devices 1684 such as keyboards (KB), one or more optical sensors, mice and various other devices (e.g., microphones, cameras, phones, storage, media players, etc.). On or more other types of sensors may optionally rely on the USB interface 1653 or another interface (e.g., I²C, etc.). As to microphones, the system 1600 of FIG. 16 may include hardware (e.g., audio card) appropriately configured for receipt of sound (e.g., user voice, ambient sound, etc.).

In the example of FIG. 16, the LPC interface 1670 provides for use of one or more ASICs 1671, a trusted platform module (TPM) 1672, a super I/O 1673, a firmware hub 1674, BIOS support 1675 as well as various types of memory 1676 such as ROM 1677, Flash 1678, and non-volatile RAM (NVRAM) 1679. With respect to the TPM 1672, this module may be in the form of a chip that can be used to authenticate software and hardware devices. For example, a TPM may be capable of performing platform authentication and may be used to verify that a system seeking access is the expected system.

The system 1600, upon power on, may be configured to execute boot code 1690 for the BIOS 1668, as stored within the SPI Flash 1666, and thereafter processes data under the control of one or more operating systems and application software (e.g., stored in system memory 1640). An operating system may be stored in any of a variety of locations and accessed, for example, according to instructions of the BIOS 1668. Again, as described herein, a satellite, a base, a server or other machine may include fewer or more features than shown in the system 1600 of FIG. 16. Further, the system 1600 of FIG. 16 is shown as optionally include cell phone circuitry 1695, which may include GSM, CDMA, etc., types of circuitry configured for coordinated operation with one or more of the other features of the system 1600. As shown, the system 1600 may include one or more batteries 1697 and, for example, battery management circuitry.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
   a display assembly that comprises a display, a display side, a back side, a frame and a serial bus socket; and
   a unitary, polymeric cable clip, attachable to the back side of the display assembly, that comprises opposing sides and a clamp disposed between the opposing sides at a clamp portion end that receives a portion of a cable that comprises a serial bus connector receivable by the serial bus socket, wherein the display assembly comprises vent walls that define vent openings and wherein the unitary, polymeric cable clip comprises prongs disposed between the opposing sides on a prong portion end and a vent wall recess between the prongs that extends between the opposing sides, wherein the unitary, polymeric cable clip is attachable to the display assembly via three vent walls of the vent walls that define two vent openings of the vent openings, wherein the three vent walls comprise a middle vent wall disposed between two adjacent vent walls that are adjacent to the middle vent wall, wherein the middle vent wall is receivable in the vent wall recess with a clearance, wherein each of the prongs is receivable in a respective one of the two vent openings, and wherein each of the prongs comprises an extension for contacting one of the two adjacent vent walls and, responsive to force applied to the clamp portion end of the unitary, polymeric cable clip, translating along the one of the two adjacent vent walls while diminishing a portion of the clearance and snapping resiliently behind the one of the two adjacent vent walls to attach the unitary, polymeric cable clip to the display assembly.

2. The system of claim 1, comprising the cable, wherein the cable is operatively coupled to an accessory mountable to the frame of the display assembly.

3. The system of claim 1, wherein the unitary, polymeric cable clip comprises a rotatable clasp.

4. The system of claim 3, wherein the unitary, polymeric cable clip comprises a clasp lock.

5. The system of claim 1 comprising:

a curved cable guide cable clip that comprises a connector portion attachable to the back side of the display assembly and a curved cable guide portion that receives a portion of the cable, wherein the curved cable guide portion comprises a first curved portion and a second curved portion that form a curved cable guide.

6. The system of claim 5, wherein the curved cable guide cable clip is a unitary component.

7. The system of claim 5, wherein the connector portion of the curved cable guide cable clip comprises a prong receivable in at least one vent opening of the vent openings of the back side of the display assembly.

8. The system of claim 7, wherein the prong comprises a T-shaped portion that comprises a width that is greater than a vent opening width, a thickness that is less than the vent opening width, a length that is greater than a vent opening wall depth and wherein rotation of the T-shaped portion locks the curved cable guide cable clip with respect to the at least one vent opening of the vent openings.

9. The system of claim 5, wherein the connector portion of the curved cable guide cable clip comprises prongs, wherein each of the prongs is receivable in at least one of the vent openings of the back side of the display assembly.

10. The system of claim 5, wherein the connector portion of the curved cable guide cable clip comprises at least one magnet that generates a magnetic attraction force with respect to magnetic material.

11. A cable clip comprising:

a connector portion removably attachable to a back side of a display assembly, wherein the connector portion comprises a prong receivable in a vent opening of the back side of the display assembly, wherein the prong comprises a T-shaped portion that comprises a width that is greater than a vent opening width, a thickness that is less than the vent opening width, and a length that is greater than a vent opening wall depth, and wherein rotation of the T-shaped portion locks the cable clip with respect to the vent opening; and a cable guide portion that receives a portion of a cable that comprises a serial bus connector receivable by a serial bus socket of the display assembly, wherein the cable guide portion comprises a rotatable clasp, and wherein, in a closed position of the rotatable clasp, an extension of the rotatable clasp is received in the same vent opening as the T-shaped portion.

12. The cable clip of claim 11, wherein the cable clip comprises a clasp lock and wherein, in a closed position, the rotatable clasp defines a cable guide space of the cable guide portion sized to prevent passage of a cable serial bus connector.

13. The cable clip of claim 12, wherein the clasp lock comprises a bolt.

14. The cable clip of claim 11, wherein, in the closed position, the extension is an anti-rotation feature such that the T-shaped extension cannot be rotated for purposes of removal.

15. The system of claim 1, wherein the unitary, polymeric cable clip is removably attachable to the back side of the display assembly.

16. A unitary, polymeric cable clip, attachable to a back side of a display assembly, comprising:

opposing sides and a clamp disposed between the opposing sides at a clamp portion end that receives a portion of a cable that comprises a serial bus connector receivable by the serial bus socket, wherein the display assembly comprises vent walls that define vent openings and wherein the unitary, polymeric cable clip comprises prongs disposed between the opposing sides on a prong portion end and a vent wall recess between the prongs that extends between the opposing sides, wherein the unitary, polymeric cable clip is attachable to the display assembly via three vent walls of the vent walls that define two vent openings of the vent openings, wherein the three vent walls comprise a middle vent wall disposed between two adjacent vent walls that are adjacent to the middle vent wall, wherein the middle vent wall is receivable in the vent wall recess with a clearance, wherein each of the prongs is receivable in a respective one of the two vent openings, and wherein each of the prongs comprises an extension for contacting one of the two adjacent vent walls and, responsive to force applied to the clamp portion end of the unitary, polymeric cable clip, translating along the one of the two adjacent vent walls while diminishing a portion of the clearance and snapping resiliently behind the one of the two adjacent vent walls to attach the unitary, polymeric cable clip to the display assembly.

17. The unitary, polymeric cable clip of claim 16, wherein the unitary, polymeric cable clip is removably attachable to the back side of the display assembly.

\* \* \* \* \*